United States Patent
Sasagawa et al.

(10) Patent No.: US 9,230,826 B2
(45) Date of Patent: Jan. 5, 2016

(54) ETCHING METHOD USING MIXED GAS AND METHOD FOR MANUFACTURING SEMICONDUCTOR DEVICE

(75) Inventors: Shinya Sasagawa, Kanagawa (JP); Hiroshi Fujiki, Kanagawa (JP); Shinobu Furukawa, Kanagawa (JP); Hidekazu Miyairi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 673 days.

(21) Appl. No.: 13/213,130

(22) Filed: Aug. 19, 2011

(65) Prior Publication Data

US 2012/0052661 A1    Mar. 1, 2012

(30) Foreign Application Priority Data

Aug. 26, 2010 (JP) ................. 2010-189928
Aug. 26, 2010 (JP) ................. 2010-190075

(51) Int. Cl.
*H01L 21/20* (2006.01)
*H01L 21/3213* (2006.01)
(Continued)

(52) U.S. Cl.
CPC ...... *H01L 21/32137* (2013.01); *H01L 29/6675* (2013.01); *H01L 29/66765* (2013.01);
(Continued)

(58) Field of Classification Search
CPC .................. H01L 21/32137; H01L 29/6675; H01L 29/66765; H01L 29/78687; H01L 29/78669; H01L 29/78672; H01L 29/78678; H01L 29/78663
USPC ............................ 438/479, 482; 257/E21.09
See application file for complete search history.

(56) References Cited

U.S. PATENT DOCUMENTS 4,242,156 A    12/1980  Peel
4,409,134 A    10/1983  Yamazaki
(Continued)

FOREIGN PATENT DOCUMENTS

DE    197 36 204 B4    2/1998
EP    0 532 314 A1    3/1993
(Continued)

OTHER PUBLICATIONS

Kim.C et al., "42,1: A Novel Four-Mask-Count Process Architecture for TFT-LCDS,", SID Digest '00 : SID International Symposium Digest of Technical Papers, 2000, vol. 31, pp. 1006-1009.
(Continued)

*Primary Examiner* — Walter H Swanson
(74) *Attorney, Agent, or Firm* — Nixon Peabody LLP; Jeffrey L. Costellia

(57) ABSTRACT

A method for etching is provided in which the etching selectivity of an amorphous semiconductor film to a crystalline semiconductor film is high. Part of a stacked semiconductor film in which an amorphous semiconductor film is provided on a crystalline semiconductor film is etched using a mixed gas of a Br-based gas, a F-based gas, and an oxygen gas, so that part of the crystalline semiconductor film provided in the stacked semiconductor film is exposed. Reduction in the film thickness of the exposed portion can be suppressed by performing the etching in such a manner. Moreover, when etching for forming a back channel portion of a thin film transistor is performed with the method for etching, favorable electric characteristics of the thin film transistor can be obtained. An insulating layer is preferably provided over the thin film transistor.

19 Claims, 23 Drawing Sheets

(51) Int. Cl.
  *H01L 29/66* (2006.01)
  *H01L 29/786* (2006.01)
(52) U.S. Cl.
  CPC .... *H01L29/78663* (2013.01); *H01L 29/78669* (2013.01); *H01L 29/78672* (2013.01); *H01L 29/78678* (2013.01); *H01L 29/78687* (2013.01)

(56) References Cited

U.S. PATENT DOCUMENTS

| | | | |
|---|---|---|---|
| 4,581,620 A | 4/1986 | Yamazaki et al. | |
| 5,101,242 A | 3/1992 | Ikeda et al. | |
| 5,221,631 A | 6/1993 | Ikeda et al. | |
| 5,262,654 A | 11/1993 | Yamazaki | |
| RE34,658 E | 7/1994 | Yamazaki et al. | |
| 5,414,442 A | 5/1995 | Yamazaki et al. | |
| 5,453,858 A | 9/1995 | Yamazaki | |
| 5,514,879 A | 5/1996 | Yamazaki | |
| 5,571,578 A | 11/1996 | Kaji et al. | |
| 5,591,987 A | 1/1997 | Yamazaki et al. | |
| 5,614,732 A | 3/1997 | Yamazaki | |
| 5,648,662 A | 7/1997 | Zhang et al. | |
| 5,650,339 A | 7/1997 | Saito et al. | |
| 5,652,453 A | 7/1997 | Iwamatsu et al. | |
| 5,656,825 A | 8/1997 | Kusumoto et al. | |
| 5,677,236 A | 10/1997 | Saitoh et al. | |
| 5,701,167 A | 12/1997 | Yamazaki | |
| 5,726,461 A | 3/1998 | Shimada et al. | |
| 5,728,259 A | 3/1998 | Suzawa et al. | |
| 5,766,989 A | 6/1998 | Maegawa et al. | |
| 5,773,330 A | 6/1998 | Park | |
| 5,835,172 A | 11/1998 | Yeo et al. | |
| 5,849,601 A | 12/1998 | Yamazaki | |
| 5,859,445 A | 1/1999 | Yamazaki | |
| 5,864,150 A | 1/1999 | Lin | |
| 5,932,302 A | 8/1999 | Yamazaki et al. | |
| 5,989,998 A | 11/1999 | Sugahara et al. | |
| 6,010,922 A | 1/2000 | Hata et al. | |
| 6,011,277 A | 1/2000 | Yamazaki | |
| 6,013,930 A | 1/2000 | Yamazaki et al. | |
| 6,023,075 A | 2/2000 | Yamazaki | |
| 6,030,873 A | 2/2000 | Iwamatsu et al. | |
| 6,087,698 A | 7/2000 | Saito et al. | |
| 6,091,467 A | 7/2000 | Kubo et al. | |
| 6,100,558 A | 8/2000 | Krivokapic et al. | |
| 6,104,065 A | 8/2000 | Park | |
| 6,121,660 A | 9/2000 | Yamazaki et al. | |
| 6,153,893 A | 11/2000 | Inoue et al. | |
| 6,171,674 B1 | 1/2001 | Yamazaki et al. | |
| 6,183,816 B1 | 2/2001 | Yamazaki et al. | |
| 6,218,219 B1 | 4/2001 | Yamazaki et al. | |
| 6,252,249 B1 | 6/2001 | Yamazaki | |
| 6,281,520 B1 | 8/2001 | Yamazaki | |
| 6,306,213 B1 | 10/2001 | Yamazaki | |
| 6,387,737 B1 | 5/2002 | Yamazaki et al. | |
| 6,388,291 B1 | 5/2002 | Zhang et al. | |
| 6,426,245 B1 | 7/2002 | Kawasaki et al. | |
| 6,433,361 B1 | 8/2002 | Zhang et al. | |
| 6,468,617 B1 | 10/2002 | Yamazaki et al. | |
| 6,468,839 B2 | 10/2002 | Inoue et al. | |
| 6,498,369 B1 | 12/2002 | Yamazaki et al. | |
| 6,555,843 B1 | 4/2003 | Yamazaki et al. | |
| 6,558,756 B2 | 5/2003 | Sugahara et al. | |
| 6,559,548 B1 | 5/2003 | Matsunaga et al. | |
| 6,693,044 B1 | 2/2004 | Yamazaki et al. | |
| 6,737,676 B2 | 5/2004 | Yamazaki | |
| 6,744,008 B1 | 6/2004 | Kasahara et al. | |
| 6,756,258 B2 | 6/2004 | Zhang et al. | |
| 6,835,523 B1 | 12/2004 | Yamazaki et al. | |
| 6,864,583 B2 | 3/2005 | Matsunaga et al. | |
| 6,876,039 B2 | 4/2005 | Okihara | |
| 7,060,323 B2 | 6/2006 | Sugahara et al. | |
| 7,067,844 B2 | 6/2006 | Yamazaki | |
| 7,067,845 B2 | 6/2006 | Murakami et al. | |
| 7,071,037 B2 | 7/2006 | Suzawa et al. | |
| 7,098,479 B1 | 8/2006 | Yamazaki | |
| 7,102,718 B1 | 9/2006 | Yamazaki et al. | |
| 7,115,902 B1 | 10/2006 | Yamazaki | |
| 7,115,903 B2 | 10/2006 | Isobe et al. | |
| 7,157,358 B2 | 1/2007 | Hall et al. | |
| 7,164,171 B2 | 1/2007 | Yamazaki et al. | |
| 7,183,211 B2 | 2/2007 | Konno et al. | |
| 7,199,846 B2 | 4/2007 | Lim | |
| 7,259,429 B2 | 8/2007 | Yamazaki | |
| 7,365,805 B2 | 4/2008 | Maekawa et al. | |
| 7,998,801 B2 | 8/2011 | Sasagawa et al. | |
| 8,253,138 B2 | 8/2012 | Yamazaki et al. | |
| 8,268,654 B2 * | 9/2012 | Fujikawa et al. | 438/30 |
| 8,704,230 B2 | 4/2014 | Miyairi | |
| 2002/0009890 A1 | 1/2002 | Hayase et al. | |
| 2002/0055209 A1 | 5/2002 | Kusumoto et al. | |
| 2002/0185466 A1 * | 12/2002 | Furuta et al. | 216/23 |
| 2004/0026696 A1 | 2/2004 | Yamazaki et al. | |
| 2004/0113214 A1 | 6/2004 | Takenaka | |
| 2004/0206956 A1 | 10/2004 | Yanai et al. | |
| 2004/0222421 A1 * | 11/2004 | Lee et al. | 257/66 |
| 2005/0012097 A1 | 1/2005 | Yamazaki | |
| 2005/0012151 A1 | 1/2005 | Yamaguchi et al. | |
| 2005/0022864 A1 | 2/2005 | Fujioka et al. | |
| 2005/0062129 A1 | 3/2005 | Komatsubara | |
| 2005/0115930 A1 | 6/2005 | Tanaka et al. | |
| 2005/0116305 A1 | 6/2005 | Hwang et al. | |
| 2006/0049449 A1 | 3/2006 | Iino et al. | |
| 2006/0113894 A1 | 6/2006 | Fujii et al. | |
| 2007/0034871 A1 | 2/2007 | Itoh et al. | |
| 2007/0045627 A1 | 3/2007 | Park et al. | |
| 2007/0080374 A1 | 4/2007 | Kurokawa | |
| 2007/0123035 A1 | 5/2007 | Sugimoto et al. | |
| 2007/0176176 A1 | 8/2007 | Yamazaki et al. | |
| 2007/0181945 A1 | 8/2007 | Nakamura | |
| 2007/0187678 A1 | 8/2007 | Hirao et al. | |
| 2007/0252179 A1 | 11/2007 | Isobe et al. | |
| 2007/0281400 A1 | 12/2007 | Yamazaki et al. | |
| 2008/0128703 A1 | 6/2008 | Ikeda et al. | |
| 2008/0128808 A1 | 6/2008 | Yamazaki et al. | |
| 2008/0132066 A1 | 6/2008 | Phan et al. | |
| 2009/0001375 A1 | 1/2009 | Yamazaki et al. | |
| 2009/0002591 A1 | 1/2009 | Yamazaki et al. | |
| 2009/0026454 A1 | 1/2009 | Kurokawa et al. | |
| 2009/0033818 A1 | 2/2009 | Nakajima et al. | |
| 2009/0045409 A1 | 2/2009 | Yamazaki et al. | |
| 2009/0047775 A1 | 2/2009 | Yamazaki et al. | |
| 2009/0057683 A1 | 3/2009 | Nakajima et al. | |
| 2009/0061573 A1 | 3/2009 | Miyairi et al. | |
| 2009/0061574 A1 | 3/2009 | Nakajima et al. | |
| 2009/0140250 A1 | 6/2009 | Yamazaki et al. | |
| 2009/0152550 A1 | 6/2009 | Ohnuma et al. | |
| 2009/0321737 A1 | 12/2009 | Isa et al. | |
| 2010/0062556 A1 | 3/2010 | Sasagawa et al. | |
| 2010/0133541 A1 | 6/2010 | Uchida et al. | |
| 2010/0148177 A1 | 6/2010 | Koyama et al. | |
| 2010/0201659 A1 * | 8/2010 | Miyake et al. | 345/205 |
| 2010/0301346 A1 | 12/2010 | Miyairi et al. | |
| 2011/0101331 A1 | 5/2011 | Yamazaki et al. | |
| 2011/0121300 A1 | 5/2011 | Miyairi et al. | |
| 2011/0147745 A1 | 6/2011 | Sasagawa et al. | |
| 2011/0147755 A1 | 6/2011 | Miyairi et al. | |

FOREIGN PATENT DOCUMENTS

| | | |
|---|---|---|
| EP | 0 535 979 A2 | 4/1993 |
| EP | 0 826 791 A2 | 3/1998 |
| EP | 1 045 447 A2 | 10/2000 |
| EP | 1 050 599 A2 | 11/2000 |
| EP | 1 182 275 A2 | 2/2002 |
| EP | 1 207 217 A1 | 5/2002 |
| EP | 1 333 476 A2 | 8/2003 |
| EP | 1 536 482 A1 | 6/2005 |
| JP | 57-071126 | 5/1982 |
| JP | 58-092217 | 6/1983 |
| JP | 59-072781 | 4/1984 |
| JP | 59-150469 | 8/1984 |
| JP | 01-117068 | 5/1989 |
| JP | 04-242724 | 8/1992 |

(56) References Cited

FOREIGN PATENT DOCUMENTS

| | | |
|---|---|---|
| JP | 04-266019 | 9/1992 |
| JP | 05-129608 | 5/1993 |
| JP | 05-226653 A | 9/1993 |
| JP | 05-267240 | 10/1993 |
| JP | 06-037313 | 2/1994 |
| JP | 06-326312 | 11/1994 |
| JP | 07-064108 | 3/1995 |
| JP | 07-131030 | 5/1995 |
| JP | 07-176753 | 7/1995 |
| JP | 07-211708 | 8/1995 |
| JP | 07-335906 | 12/1995 |
| JP | 08-018055 | 1/1996 |
| JP | 08-115899 | 5/1996 |
| JP | 08-125195 | 5/1996 |
| JP | 08-153699 | 6/1996 |
| JP | 08-335702 | 12/1996 |
| JP | 09-023010 | 1/1997 |
| JP | 09-092644 | 4/1997 |
| JP | 09-512667 | 12/1997 |
| JP | 10-020298 | 1/1998 |
| JP | 11-121761 | 4/1999 |
| JP | 11-258636 | 9/1999 |
| JP | 2000-077665 A | 3/2000 |
| JP | 2000-277439 | 10/2000 |
| JP | 2001-007024 | 1/2001 |
| JP | 2001-053283 | 2/2001 |
| JP | 2001-217424 | 8/2001 |
| JP | 3474286 | 12/2003 |
| JP | 2004-014958 | 1/2004 |
| JP | 2004-342866 A | 12/2004 |
| JP | 2005-019859 | 1/2005 |
| JP | 2005-049832 | 2/2005 |
| JP | 2005-167051 | 6/2005 |
| JP | 2005-167207 | 6/2005 |
| JP | 2005-183774 | 7/2005 |
| JP | 2005-191546 | 7/2005 |
| JP | 2006-295031 A | 10/2006 |
| JP | 2008-124392 | 5/2008 |
| JP | 2009-044134 | 2/2009 |
| JP | 2009-135482 A | 6/2009 |
| JP | 2010-021442 A | 1/2010 |
| WO | WO-2004/086487 | 10/2004 |
| WO | WO-2009/060922 | 5/2009 |

OTHER PUBLICATIONS

Arai.T et al., "41.2: Micro Silicon Technology for Active Matrix OLED Display,", SID Digest '07 : SID International Symposium Digest of Technical Papers, 2007, vol. 38, pp. 1370-1373.

Fujiwara.H et al., "Stress-Induced Nucleation of Microcrystalline Silicon from Amorphous Phase,", Jpn. J. Appl. Phys. (Japanese Journal of Applied Physics), May 15, 2002, vol. 41, No. 5A, pp. 2821-2828.

Kamei.T et al., "A Significant Reduction of Impurity Contents in Hydrogenated Microcrystalline Silicon Films for Increased Grain Size and Reduced Defect Density,", Jpn. J. Appl. Phys. (Japanese Journal of Applied Physics), Mar. 1, 1998, vol. 37, No. 3A, pp. L265-L268.

Lee.C et al., "How to Achieve High Mobility Thin Film Transistors by Direct Deposition of Silicon Using 13.56 MHz RF PECVD?,", IEDM 06: Technical Digest of International Electron Devices Meeting, Dec. 11, 2006, pp. 295-298.

Lee.C et al., "Directly Deposited Nanocrystalline Silicon Thin-Film Transistors With Ultra High Mobilities,", Appl. Phys. Lett. (Applied Physics Letters), Dec. 18, 2006, vol. 89, No. 25, pp. 252101-1-252101-3.

Song.J et al., "34.1: Advanced Four-Mask Process Architecture for the A-Si TFT Array Manufacturing Method,", SID Digest '02 : SID International Symposium Digest of Technical Papers, 2002, vol. 33, pp. 1038-1041.

Choi.S et al., "P-16: Novel Four-Mask Process in the FFS TFT-LCD With Optimum Multiple-Slit Design Applied by the Use of a Gray-Tone Mask,", SID Digest '05 : SID International Symposium Digest of Technical Papers, 2005, vol. 36, pp. 284-287.

Lee.C et al., "High-Mobility Nanocrystalline Silicon Thin-Film Transistors Fabricated by Plasma-Enhanced Chemical Vapor Deposition,", Appl. Phys. Lett. (Applied Physics Letters), May 24, 2005, vol. 86, pp. 222106-1-222106-3.

Lee.C et al., "High-Mobility N-Channel and P-Channel Nanocrystalline Silicon Thin-Film Transistors,", IEDM 05: Technical Digest of International Electron Devices Meeting, 2005, pp. 937-940.

Esmaeili-Rad.M et al., "High Stability, Low Leakage Nanocrystalline Silicon Bottom Gate Thin Film Transistors for AMOLED Displays,", IEDM 06: Technical Digest of International Electron Devices Meeting, 2006, pp. 303-306.

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced From Constant Current Stress Measurements,", Appl. Phys. Lett. (Applied Physics Letters), Sep. 12, 2007, vol. 91, No. 11, pp. 113511-1-113511-3.

Lee.C et al., "Stability of Nc-Si:H TFTs With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Esmaeili-Rad.M et al., "Stability of Nanocrystalline Silicon Bottom-Gate Thin Film Transistors With Silicon Nitride Gate Dielectric,", J. Appl. Phys. (Journal of Applied Physics), Sep. 28, 2007, vol. 102, No. 6, pp. 064512-1-064512-7.

Lee.C et al., "Top-Gate TFTs Using 13.56MHZ PECVD Microcrystalline Silicon,", IEEE Electron Device Letters, Sep. 5, 2005, vol. 26, No. 9, pp. 637-639.

Lee.C et al., "Postdeposition Thermal Annealing and Material Stability of 75°C. Hydrogenated Nanocrystalline Silicon Plasma-Enhanced Chemical Vapor Deposition Films,", J. Appl. Phys. (Journal of Applied Physics), Aug. 4, 2005, vol. 98, No. 3, pp. 034305-1-034305-7.

Fujiwara.H et al., "Microcrystalline silicon nucleation sites in the sub-surface of hydrogenated amorphous silicon,", Surface Science, 2002, vol. 497, No. 1-3, pp. 333-340.

Fujiwara.H et al., "Real-time spectroscopic ellipsometry studies of the nucleation and grain growth processes in microcrystalline silicon thin films,", Phys. Rev. B (Physical Review. B), Feb. 23, 2001, vol. 63, pp. 115306-1-115306-9.

* cited by examiner

FIG. 1A-1
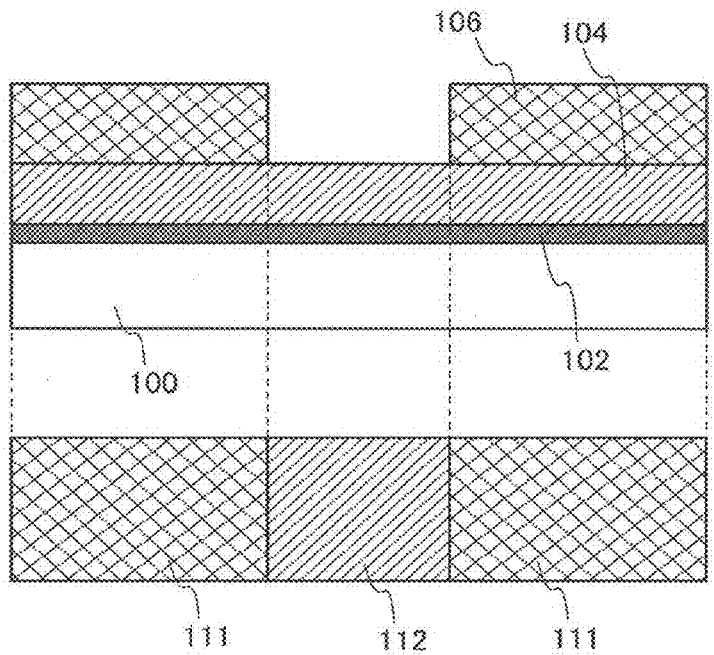
FIG. 1A-2
FIG. 1B
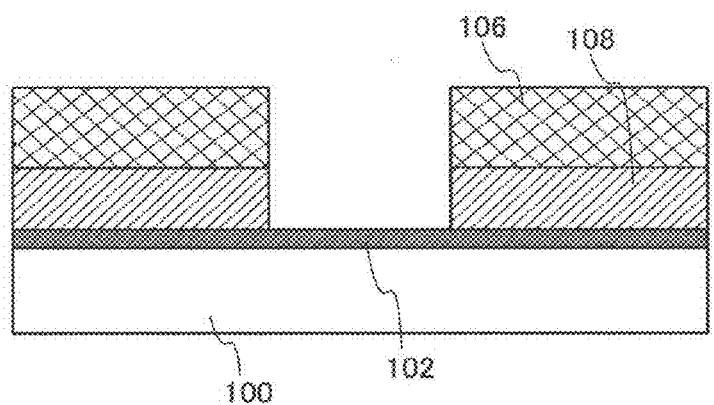
FIG. 1C
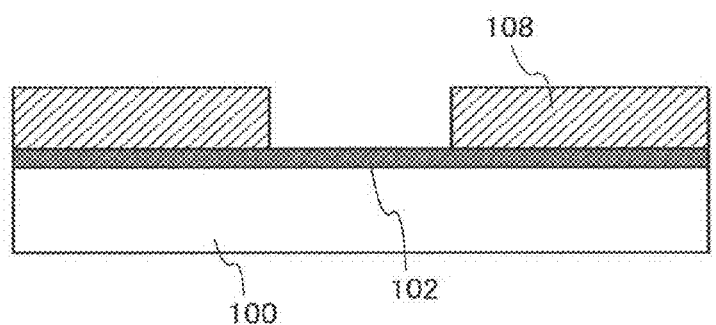

ETCHING METHOD USING MIXED GAS AND METHOD FOR MANUFACTURING SEMICONDUCTOR DEVICE

BACKGROUND OF THE INVENTION

1. Field of the Invention

The present invention relates to a method for etching. The present invention relates to a semiconductor device and a method for manufacturing the semiconductor device. Note that in this specification, a semiconductor element itself or a device including a semiconductor element is referred to as a semiconductor device. A semiconductor device includes a liquid crystal display device and the like.

2. Description of the Related Art

In resent years, semiconductor devices have been necessary for human life. Semiconductor elements such as thin film transistors included in such semiconductor devices are manufactured by forming a thin film over a substrate and processing the thin film into a desired shape by etching or the like. Such a manufacturing method is applied to liquid crystal display devices (e.g., liquid crystal televisions), for example.

In thin film transistors of conventional liquid crystal televisions, amorphous silicon films are often used as semiconductor films. This is because structures of thin film transistors formed of amorphous silicon films are thought to be manufactured with relative ease.

However, when the current circumstances of moving images (e.g., watching movies and sports in 3D) is taken into account, sharpness of moving images in a liquid crystal television using amorphous silicon films is insufficient; therefore, thin film transistors having high carrier mobility which responds at high speed are under development. For this reason, microcrystalline silicon films have been developed (e.g., Patent Document 1).

REFERENCE

[Patent Document 1] Japanese Published Patent Application No. 2001-217424
[Patent Document 2] Japanese Published Patent Application No. H5-267240

SUMMARY OF THE INVENTION

A thin film transistor disclosed in Patent Document 1 has a structure in which an amorphous silicon film is provided on a microcrystalline silicon film, the microcrystalline silicon film and the amorphous silicon film are formed of the same material, and part of the microcrystalline silicon film is exposed in a channel formation region of the thin film transistor. When such a structure is manufactured, the thickness of the microcrystalline silicon film in the exposed region is reduced or the amorphous silicon film is not sufficiently etched. This is because when a crystalline semiconductor film and an amorphous semiconductor film are formed of the same kind of material, it is difficult to make the etching rate of the crystalline semiconductor film significantly different from that of the amorphous semiconductor film (that is, to make the etching selectivity high). As etching of the crystalline semiconductor film and the amorphous semiconductor film, dry etching using a fluorine-based gas as a source gas and wet etching using hydrofluoric acid are exemplified in Patent Document 1. However, even in the case of the dry etching using a fluorine-based gas as a source gas, it is difficult to obtain sufficiently high etching selectivity between the microcrystalline silicon film and the amorphous silicon film.

An object of one embodiment of the present invention is to provide a method for etching in which the etching selectivity of an amorphous semiconductor film to a crystalline semiconductor film is high.

Another object of one embodiment of the present invention is to obtain favorable characteristics of a semiconductor device by employing the method for etching.

One embodiment of the present invention is a method for etching including the steps of performing etching on part of a stacked semiconductor film in which an amorphous semiconductor film is provided on a crystalline semiconductor film with the use of a mixed gas of a Br-based gas, a F-based gas, and an oxygen gas; and exposing part of the crystalline semiconductor film provided in the stacked semiconductor film. Note that a Br-based gas is a gas including Br and a F-based gas is a gas including F.

As described above, as a reference disclosing a method for etching with the use of a mixed gas of a Br-based gas, a F-based gas, and an oxygen gas, Patent Document 2 can be given, for example. In Patent Document 2, a method for etching a tungsten silicide film in which the etching selectivity of the tungsten silicide film to a silicon oxide film is high is disclosed. According to Patent Document 2, etching of the tungsten silicide film is performed by reactive ion etching with the use of a mixed gas of $SF_6$, HBr, and $O_2$. That is, in the techniques disclosed in Patent Document 2, the method for etching is a method for etching when a silicon oxide film is a base film and a tungsten silicide film is an etched film, and the etching selectivity of these films is high. Consequently, the base film and the etched film in the method for etching of Patent Document 2 are different from a base film and an etched film in the method for etching of one embodiment of the present invention.

In other words, one embodiment of the present invention is a method for etching including the steps of performing etching on part of a stacked semiconductor film in which an amorphous semiconductor film is provided on a crystalline semiconductor film with the use of a mixed gas including at least a Br-based gas, a F-based gas, and an oxygen gas; and exposing the crystalline semiconductor film provided in the stacked semiconductor film.

Another embodiment of the present invention is a method for etching including the steps of forming an etching mask over a first region of a stacked semiconductor film in which an amorphous semiconductor film is provided on a crystalline semiconductor film and whose top surface includes the first region and a second region; and exposing the crystalline semiconductor film in the second region by performing etching with the use of a mixed gas including at least a Br-based gas, a F-based gas, and an oxygen gas.

Note that the etching with the use of the mixed gas is performed with bias power greater than 0 W and less than or equal to 100 W.

The Br-based gas is preferably a HBr gas.
The F-based gas is preferably a $SF_6$ gas.
A flow ratio of the Br-based gas, the F-based gas, and the oxygen gas is preferably 25:2:1.

As the crystalline semiconductor film, a microcrystalline semiconductor film can be given, for example.

For the microcrystalline semiconductor film, for example, microcrystalline silicon can be used and for the amorphous semiconductor film, for example, amorphous silicon can be used.

Further, one embodiment of the present invention is a method for manufacturing a thin film transistor employing the method for etching.

In other words, one embodiment of the present invention is a method for manufacturing a semiconductor device including the steps of: forming a crystalline semiconductor film over a first insulating layer provided to cover a first conductive layer; forming an amorphous semiconductor film over the crystalline semiconductor film; forming an impurity semiconductor film over the amorphous semiconductor film; regioselectively forming a first etching mask over the impurity semiconductor film; forming a thin film stack by removing a portion of the crystalline semiconductor film, the amorphous semiconductor film, and the impurity semiconductor film which does not overlap with the first etching mask and processing the crystalline semiconductor film, the amorphous semiconductor film, and the impurity semiconductor film to have an island shape; removing the first etching mask; forming a conductive film which is to be a second conductive layer over the thin film stack; regioselectively forming a second etching mask over the conductive film which is to be the second conductive layer; forming the second conductive layer by etching the conductive film which is to be the second conductive layer; and exposing a portion of the crystalline semiconductor film which does not overlap with the second conductive layer by etching a region of the thin film stack which does not overlap with the second conductive layer. In addition, a mixed gas of a Br-based gas, a F-based gas, and an oxygen gas is used in the etching for exposing the crystalline semiconductor film.

Further, one embodiment of the present invention is a method for manufacturing a semiconductor device including the steps of: forming a crystalline semiconductor film over a first insulating layer provided to cover a first conductive layer; forming an amorphous semiconductor film over the crystalline semiconductor film; forming an impurity semiconductor film over the amorphous semiconductor film; regioselectively forming a first etching mask over the impurity semiconductor film; forming a thin film stack by removing a portion of the crystalline semiconductor film, the amorphous semiconductor film, and the impurity semiconductor film which does not overlap with the first etching mask and processing the crystalline semiconductor film, the amorphous semiconductor film, and the impurity semiconductor film to have an island shape; removing the first etching mask; forming a conductive film which is to be a second conductive layer and an insulating film which is to be a second insulating layer over the thin film stack; regioselectively forming a second etching mask over the insulating film which is to be the second insulating layer; forming the second insulating layer by etching the insulating film which is to be the second insulating layer; forming the second conductive layer by etching the conductive film which is to be the second conductive layer; and exposing a portion of the crystalline semiconductor film which does not overlap with the second conductive layer by etching a region of the thin film stack which does not overlap with the second conductive layer. In addition, a mixed gas of a Br-based gas, a F-based gas, and an oxygen gas is used in the etching for exposing the crystalline semiconductor film.

In the method for manufacturing a semiconductor device, the second insulating layer and the second conductive layer may be formed through the same etching step.

Further, in the method for manufacturing a semiconductor device, the second etching mask is preferably removed before performing the etching for exposing a portion of the crystalline semiconductor film which does not overlap with the second conductive layer. This is because in the case where the second etching mask is a resist mask, when a resist stripper is used at the time of removing the resist mask, a constituent of the resist stripper remains in a back channel portion, resulting in an increase of off-state current.

Note that the etching with the use of the mixed gas is performed with bias power greater than 0 W and less than or equal to 100 W.

The Br-based gas is preferably a HBr gas.

The F-based gas is preferably a $SF_6$ gas.

A flow ratio of the Br-based gas, the F-based gas, and the oxygen gas is preferably 25:2:1.

As the crystalline semiconductor film, a microcrystalline semiconductor film can be given, for example.

For the microcrystalline semiconductor film, for example, microcrystalline silicon can be used and for the amorphous semiconductor film, for example, amorphous silicon can be used.

Note that in this specification, a pixel transistor is exemplified as a transistor when a semiconductor device is described. However, the transistor is not limited thereto and a semiconductor device of one embodiment of the present invention may include a transistor other than a pixel transistor.

According to a method for etching that is one embodiment of the present invention, high etching selectivity of an amorphous semiconductor film to a crystalline semiconductor film can be obtained.

According to a method for manufacturing a thin film transistor that is one embodiment of the present invention, in the case where an amorphous semiconductor film is provided on a crystalline semiconductor film and part of the etched crystalline semiconductor film is exposed by etching part of the amorphous semiconductor film, reduction in the film thickness of the part of the crystalline semiconductor film can be suppressed. Thus, the thickness of part of the crystalline semiconductor film which is to be a channel formation region can be kept sufficiently large, so that a thin film transistor with favorable electric characteristics can be manufactured. In other words, a thin film transistor with a small subthreshold swing value (S value), a small threshold voltage, or low off-state current can be obtained.

BRIEF DESCRIPTION OF THE DRAWINGS

FIGS. 1A-1, 1A-2, 1B, and 1C illustrate a method for etching of one embodiment the present invention.

FIGS. 9A-1, 9A-2, 9B-1, 9B-2, 9C-1, and 9C-2 illustrate the method for manufacturing the semiconductor device of one embodiment of the present invention.

FIGS. 10A-1, 10A-2, 10B-1, 10B-2, 10C-1, 10C-2, 10D-1, and 10D-2 illustrate the method for manufacturing the semiconductor device of one embodiment of the present invention.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description of the embodiments below.

Embodiment 1

In this embodiment, a method for etching that is one embodiment of the present invention will be described.

In one embodiment of the method for etching described in this embodiment, part of a stacked semiconductor film in which an amorphous semiconductor film is provided on a crystalline semiconductor film is etched using a mixed gas including at least a Br-based gas, a F-based gas, and an oxygen gas, so that part of the crystalline semiconductor film in the stacked semiconductor film is exposed.

In one embodiment of the method for etching described in this embodiment, an etching mask is formed over a first region in a stacked semiconductor film in which an amorphous semiconductor film is provided on a crystalline semiconductor film and whose top surface includes the first region and a second region; and part of the crystalline semiconductor film in the second region is exposed by etching with the use of a mixed gas including at least a Br-based gas, a F-based gas, and an oxygen gas.

FIGS. 1A-1, 1A-2, 1B, and 1C are schematic views of one embodiment of the method for etching described in this embodiment.

Figures 1, 9A:
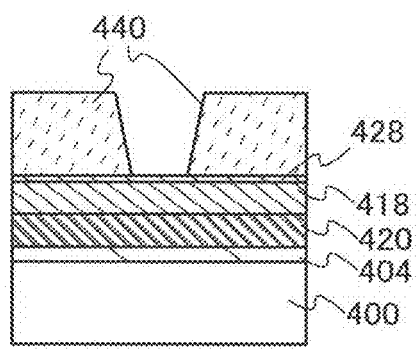

First, a substrate 100 over which a crystalline semiconductor film 102 and an amorphous semiconductor film 104 are stacked is prepared. An etching mask 106 is formed over the amorphous semiconductor film 104 (FIG. 1A-1). Note that a semiconductor film in which the crystalline semiconductor film 102 and the amorphous semiconductor film 104 are stacked is called a stacked semiconductor film.

As the substrate 100, any of the following can be used: an alkali-free glass substrate formed of barium borosilicate glass, aluminoborosilicate glass, aluminosilicate glass, or the like manufactured by a fusion method or a float method; a ceramic substrate; a plastic substrate having heat resistance enough to withstand a process temperature of this manufacturing process; and the like. Alternatively, a semiconductor substrate such as a silicon substrate or a metal substrate such as a stainless steel substrate can be used. That is to say, the kind of the substrate 100 is not particularly limited.

The crystalline semiconductor film 102 is a semiconductor film most part of which is crystalline. As a crystalline semiconductor, a microcrystalline semiconductor can be given, for example. Here, the microcrystalline semiconductor is a semiconductor having an intermediate structure between amorphous and crystalline structures (including a single crystal structure and a polycrystalline structure). A microcrystalline semiconductor is a semiconductor having a third state that is stable in terms of free energy and is a crystalline semiconductor having short-range order and lattice distortion, in which columnar or needle-like crystals having a grain size of greater than or equal to 2 nm and less than or equal to 200 nm, preferably greater than or equal to 10 nm and less than or equal to 80 nm, more preferably more than or equal to 20 nm and less than or equal to 50 nm have grown in a direction of the normal to the substrate surface. Thus, crystal grain boundaries are formed at the interface of the columnar or needle-like crystal grains in some cases. Note that the diameter of the grain here means a maximum diameter of a crystal grain in a plane parallel to the substrate surface. Further, the crystal grain includes an amorphous semiconductor region and a crystallite which is a minute crystal that can be regarded as a single crystal. The crystal grain includes a twin crystal in some cases.

Microcrystalline silicon, which is one of microcrystalline semiconductors, has a peak of Raman spectrum which is shifted to a lower wave number side than 520 cm$^{-1}$ that represents single crystal silicon. That is, the peak of a Raman spectrum of microcrystalline silicon is within the range from 520 cm$^{-1}$ which represents single crystal silicon to 480 cm$^{-1}$ which represents amorphous silicon. In addition, hydrogen or halogen of at least 1 at. % is contained in the microcrystalline silicon in order to terminate a dangling bond. Moreover, a rare gas element such as He, Ar, Kr, or Ne may be contained in the microcrystalline silicon to further promote lattice distortion, so that the stability is increased and a favorable microcrystalline semiconductor can be obtained.

The amorphous semiconductor film 104 is a semiconductor film most part of which is amorphous.

The amorphous semiconductor film 104 may include a minute semiconductor crystal grain and the like. For example, a semiconductor film including an amorphous semiconductor and a minute semiconductor crystal grain, having lower energy at the Urbach edge, which is measured by a constant photocurrent (CPM) method or photoluminescence spectrometry, and having a smaller quantity of absorption spectra of defects, as compared to a conventional amorphous semiconductor film. As compared to the conventional amorphous semiconductor film, such a semiconductor film is a well-ordered semiconductor film which has few defects and a steep tail slope of a level at a band edge (a mobility edge) in the valence band. Such a semiconductor layer is referred to as a "film containing an amorphous semiconductor" or a "layer containing an amorphous semiconductor" in this specification.

The amorphous semiconductor film 104 may contain halogen and/or nitrogen. When nitrogen is contained, nitrogen may be contained as an NH group or an $NH_2$ group.

As the etching mask 106, a resist mask or the like can be used. Note that the etching mask 106 is not particularly limited as long as it functions as a mask for etching.

Figures 2, 9A:
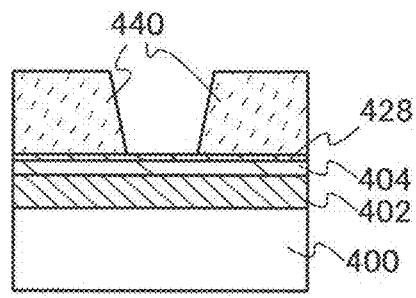

Here, the etching mask 106 is formed over a first region 111 in the amorphous semiconductor film 104 in a top view in FIG. 1A-2. Note that in FIG. 1A-2 which is the top view of FIG. 1A-1, a region in the amorphous semiconductor film 104 other than the first region 111 is a second region 112.

Then, etching is performed using the etching mask 106 provided over the first region 111. Here, etching is performed using a mixed gas of a Br-based gas, a F-based gas, and an oxygen gas. With the use of a mixed gas of a Br-based gas, a F-based gas, and an oxygen gas, the etching rate of the crystalline semiconductor film 102 can be low and the etching rate of the amorphous semiconductor film 104 can be high. In other words, the etching selectivity between the crystalline semiconductor film 102 and the amorphous semiconductor film 104 can be high. For this reason, in the case where the amorphous semiconductor film 104 in the second region 112 is removed and the crystalline semiconductor film 102 in the second region 112 is exposed, reduction in the film thickness of the crystalline semiconductor film 102 in the second region 112 can be suppressed. Thus, the thickness of the crystalline semiconductor film 102 in the first region 111 can be almost equal to the thickness of the crystalline semiconductor film 102 in the second region 112 (FIG. 1B). Note that the amorphous semiconductor film 104 is etched to be an amorphous semiconductor layer 108 in this step.

Note that bias power of the etching with the use of the mixed gas may be greater than 0 W and less than or equal to 100 W. At this time, the area of an electrode is preferably more than or equal to 340 $cm^2$.

Note that as the Br-based gas, a HBr gas can be given, for example.

Note that as the F-based gas, a $SF_6$ gas, a $CF_4$ gas, or a $NF_3$ gas can be given, for example.

Note that the flow rate of a HBr gas, a $SF_6$ gas, and an oxygen gas is preferably 25:2:1.

Then, the etching mask 106 is removed (FIG. 1C).

As described above, according to the method for etching of one embodiment of the present invention, the etching selectivity of an amorphous semiconductor film to a crystalline semiconductor film can be high.

Embodiment 2

In this embodiment, a manufacturing method of a semiconductor device that is one embodiment of the present invention will be described. Specifically, a method for manufacturing a thin film transistor to which the method for etching described in Embodiment 1 is applied will be described with reference to FIGS. 2A to 2D and FIGS. 3A to 3D.

Figure 2A:
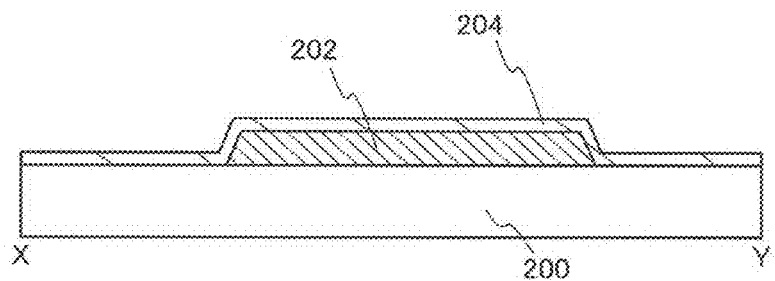
FIGS. 2A to 2D illustrate a method for manufacturing a semiconductor device of one embodiment of the present invention.

First, a first conductive layer 202 is formed over a substrate 200, and a first insulating layer 204 is formed so as to cover the first conductive layer 202 (FIG. 2A).

The substrate 200 is an insulating substrate. As the substrate 200, for example, in addition to a glass substrate, a quartz substrate, and a ceramic substrate, a plastic substrate or the like with heat resistance that is high enough to withstand a process temperature in this manufacturing process can be used. In the case where the substrate 200 is a glass substrate, any of the substrate of the first generation (e.g., 320 mm×400 mm) to the tenth generation (e.g., 2950 mm×3400 mm) can be used; however, the substrate is not limited thereto. Note that reduction in the film thickness of a semiconductor layer serving as a channel formation region on a substrate surface can be suppressed by employing the method for etching of one embodiment of the present invention; thus, difference of the film thickness in the semiconductor layer on the substrate surface can be suppressed. The effect of the present invention is notable particularly in the case where a large-sized substrate of the eighth generation or later is used.

The first conductive layer 202 may be formed in such a manner that a conductive film (e.g., a metal film or a semiconductor film to which an impurity element imparting one conductivity type is added) is formed by a sputtering method, an etching mask is formed over the conductive film, and selective etching is performed. Alternatively, an ink-jet method may be used. Note that the conductive film serving as the first conductive layer 202 may be formed to have either a single-layer structure or a layered structure including a plurality of layers. For example, the conductive film may be formed to have a three-layer structure in which an Al layer is sandwiched between Ti layers. Note that the first conductive layer 202 forms at least a scan line and a gate electrode.

As the first insulating layer 204, for example, a film may be formed using an insulating material (e.g., silicon nitride, silicon nitride oxide, silicon oxynitride, or silicon oxide) by a plasma CVD method. Note that the first insulating layer 204 may be formed to have either a single-layer structure or a layered structure including a plurality of layers. A layered structure of two layers in which a silicon oxynitride layer is stacked over a silicon nitride layer is employed here, for example. The first insulating layer 204 forms at least a gate insulating layer.

Note that "silicon nitride oxide" contains more nitrogen than oxygen, and in the case where measurements are performed using Rutherford backscattering spectrometry (RBS) and hydrogen forward scattering (HFS), preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. % respectively.

"Silicon oxynitride" contains more oxygen than nitrogen, and in the case where measurements are performed using RBS and HFS, preferably contains oxygen, nitrogen, silicon, and hydrogen at 50 at. % to 70 at. %, 0.5 at. % to 15 at. %, 25 at. % to 35 at. %, and 0.1 at. % to 10 at. % respectively.

Note that percentages of nitrogen, oxygen, silicon, and hydrogen fall within the ranges given above, where the total number of atoms contained in the silicon oxynitride or the silicon nitride oxide is defined as 100 at. %.

Note that here, it is preferable to expose a surface of the first insulating layer 204 to plasma generated by an $N_2O$ gas. This is because the surface of the first insulating layer 204 is oxidized and the crystallinity of a first semiconductor film 206 formed thereover can be improved by exposing the surface of the first insulating layer 204 to the plasma generated by the $N_2O$ gas. Here, a gas generating plasma is not limited to an $N_2O$ gas and may be a gas which can oxidize the surface of the first insulating layer 204 (an oxidation gas or a gas containing oxygen).

Figure 2B:
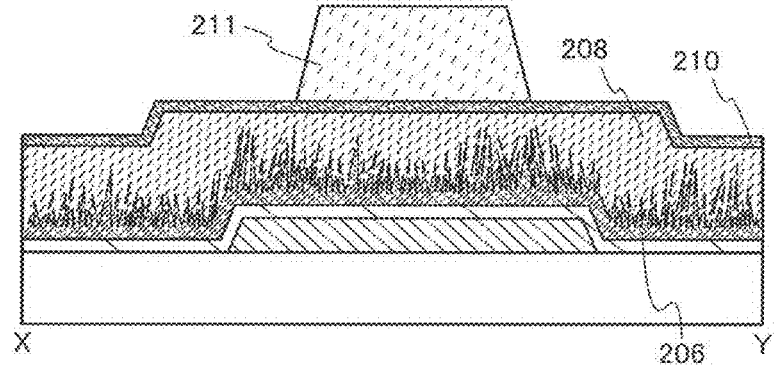

Next, the first semiconductor film 206, a second semiconductor film 208, and an impurity semiconductor film 210 are formed over the first insulating layer 204 in this order. An etching mask 211 is formed over the impurity semiconductor film 210 (FIG. 2B). The etching mask 211 may be formed of a resist material.

The first semiconductor film 206 is a semiconductor film most part of which is crystalline. As a crystalline semiconductor, a microcrystalline semiconductor can be given, for example. Here, a microcrystalline semiconductor is a semiconductor having an intermediate structure between amorphous and crystalline structures (including a single crystal structure and a polycrystalline structure). A microcrystalline semiconductor is a semiconductor having a third state that is stable in terms of free energy and is a crystalline semiconductor having short-range order and lattice distortion, in which columnar or needle-like crystals having a grain size of greater than or equal to 2 nm and less than or equal to 200 nm, preferably greater than or equal to 10 nm and less than or equal to 80 nm, more preferably more than or equal to 20 nm and less than or equal to 50 nm have grown in a direction of the normal to the substrate surface. Thus, crystal grain boundaries are formed at the interface of the columnar or needle-like crystal grains in some cases. Note that the diameter of the grain here means a maximum diameter of a crystal grain in a plane parallel to the substrate surface. Further, the crystal grain includes an amorphous semiconductor region and a crystallite which is a minute crystal that can be regarded as a single crystal. The crystal grain includes a twin crystal in some cases.

Microcrystalline silicon may be used as the microcrystalline semiconductor. Microcrystalline silicon, which is one of microcrystalline semiconductors, has a peak of a Raman spectrum which is shifted to a lower wave number side than 520 cm$^{-1}$ that represents single crystal silicon. That is, the peak of a Raman spectrum of microcrystalline silicon is within the range from 520 cm$^{-1}$ which represents single crystal silicon to 480 cm$^{-1}$ which represents amorphous silicon. In addition, hydrogen or halogen of at least 1 at. % is contained in the microcrystalline silicon in order to terminate a dangling bond. Moreover, a rare gas element such as He, Ar, Kr, or Ne may be contained in the microcrystalline silicon to further promote lattice distortion, so that the stability is increased and a favorable microcrystalline semiconductor can be obtained.

The crystallinity can be improved when the concentration of oxygen and nitrogen (measured by a secondary ion mass spectrometry (SIMS) method) included in a crystalline semiconductor film is lowered, preferably to lower than $1 \times 10^{18}$ cm$^{-3}$.

Note that it is preferable to form a crystalline semiconductor film through two-step film formation process. For example, in the two-step film formation process, a microcrystalline silicon film with a thickness of about 5 nm may be formed under a pressure of about 500 Pa at the first stage and a microcrystalline silicon film with a desired thickness may be formed under a pressure of about 5000 Pa at the second stage. The flow rate of silane at the second stage may be smaller than that at the first stage so that a high-dilution condition is set.

The second semiconductor film 208 is a semiconductor film most part of which is amorphous and serving as a buffer layer. The second semiconductor film 208 is preferably a semiconductor film including an amorphous semiconductor and a minute semiconductor crystal grain, having lower energy at the Urbach edge, which is measured by a constant photocurrent (CPM) method or photoluminescence spectrometry, and having a smaller quantity of absorption spectra of defects, as compared to a conventional amorphous semiconductor film. As compared to the conventional amorphous semiconductor film, such a semiconductor film is a well-ordered semiconductor film which has few defects and a steep tail slope of a level at a band edge (a mobility edge) in the valence band.

The second semiconductor film 208 may contain halogen and/or nitrogen. When nitrogen is contained, nitrogen may be contained as an NH group or an NH$_2$ group.

Note that here, an interface region between the first semiconductor film 206 and the second semiconductor film 208 preferably has microcrystalline semiconductor regions and an amorphous semiconductor region filling the space between the microcrystalline semiconductor regions. Specifically, the interface region between the first semiconductor film 206 and the second semiconductor film 208 includes a microcrystalline semiconductor region which extends in a conical or pyramidal shape from the first semiconductor film 206 and "a film containing an amorphous semiconductor" which is similar to the second semiconductor film 208.

A buffer layer is formed using the second semiconductor film 208, whereby the off-state current of a transistor can be reduced. Further, since the interface region has the conical or pyramidal microcrystalline semiconductor regions, resistance in the vertical direction (the film thickness direction), that is, resistance between the second semiconductor film 208 and a source region or a drain region formed using the impurity semiconductor film 210, can be lowered. Thus, the on-state current of the transistor can be increased. That is to say, as compared to the case of using the conventional amorphous semiconductor, the off-state current can be sufficiently reduced and reduction in the on-state current can be suppressed; thus, switching characteristics of the transistor can be improved.

Note that as a first semiconductor layer formed using the first semiconductor film 206 is thinner in the completed transistor, the on-state current is decreased. As the first semiconductor layer formed using the first semiconductor film 206 is thicker in the completed transistor, the off-state current is increased because a contact area between the first semiconductor layer formed using the first semiconductor film 206 and a second conductive layer formed later is increased. Consequently, to increase the on/off ratio, it is preferable to form the first semiconductor film 206 to have a large thickness and further to perform insulation treatment on side surfaces of a thin film stack 212 including the first semiconductor layer formed using the first semiconductor film 206.

Most part of the above microcrystalline semiconductor region preferably includes a crystal grain having a conical or pyramidal shape whose top gets narrower from the first semiconductor film 206 toward the second semiconductor film 208. Alternatively, the most part of the microcrystalline semiconductor region may include a crystal grain having an inverted conical or pyramidal shape whose top gets wider from the first semiconductor film 206 toward the second semiconductor film 208.

When the microcrystalline semiconductor region includes a crystal grain having a conical or pyramidal shape whose top gets narrower from the first semiconductor film 206 toward the second semiconductor film 208 in the above interface region, the proportion of the microcrystalline semiconductor region on the first semiconductor film 206 side is higher than that on the second semiconductor film 208 side. The microcrystalline semiconductor region grows from a surface of the first semiconductor film 206 in the film thickness direction. When the flow rate of hydrogen with respect to that of a deposition gas (e.g., silane) is low (that is, the dilution ratio is low) or the concentration of a source gas containing nitrogen is high, crystal growth of the microcrystalline semiconductor region is suppressed, and thus, a crystal grain comes to have a conical or pyramidal shape, and most part of the semiconductor formed by the deposition of the crystal grain is amorphous.

Further, the interface region preferably contains nitrogen, in particular, an NH group or an $NH_2$ group. This is because defects are reduced and carriers flow easily when nitrogen, in particular, an NH group or an $NH_2$ group is bonded with dangling bonds of silicon atoms at an interface of a crystal included in the microcrystalline semiconductor region or at the interface between the microcrystalline semiconductor region and the amorphous semiconductor region. Thus, the interface region contains nitrogen, preferably an NH group or an $NH_2$ group at $1 \times 10^{20}$ $cm^{-3}$ to $1 \times 10^{21}$ $cm^{-3}$, the dangling bonds of silicon atoms can be easily cross-linked with nitrogen, preferably an NH group or an $NH_2$ group, so that carriers can flow more easily. As a result, a bond which promotes the carrier transfer is formed at a crystal grain boundary or a defect, whereby the carrier mobility of the interface region is increased. Therefore, the field effect mobility of the transistor is improved.

Further, when the concentration of oxygen in the interface region is reduced, the defect density at the interface between the microcrystalline semiconductor region and the amorphous semiconductor region or the interface between crystal grains can be reduced, so that bonds inhibiting carrier transfer can be reduced.

The impurity semiconductor film 210 is formed using a semiconductor to which an impurity element imparting one conductivity type is added. In the case where the transistor is an n-channel transistor, for example, silicon to which P or As is added is given as a semiconductor to which an impurity element imparting one conductivity type is added. In the case where the transistor is a p-channel transistor, for example, it is possible to add B as the impurity element imparting one conductivity type; however, it is preferable to use an n-channel transistor. Therefore, silicon to which P is added is used here as an example. The impurity semiconductor film 210 may be formed using an amorphous semiconductor or a crystalline semiconductor such as a microcrystalline semiconductor.

When the impurity semiconductor film 210 is formed of an amorphous semiconductor, the flow rate of a dilution gas is greater than or equal to that of a deposition gas and less than or equal to 10 times that of the deposition gas, preferably greater than or equal to that of the deposition gas and less than or equal to 5 times that of the deposition gas. On the other hand, when the impurity semiconductor film 210 is formed of a crystalline semiconductor, the flow rate of the dilution gas is greater than or equal to 10 times that of a deposition gas and less than or equal to 2000 times that of the deposition gas, preferably greater than or equal to 50 times that of the deposition gas and less than or equal to 200 times that of the deposition gas.

Note that it is preferable that the first insulating layer 204 to the impurity semiconductor film 210 be formed successively in the same chamber. This is in order to prevent impurities from being included in the interfaces between the first insulating layer 204 to the impurity semiconductor film 210.

Figure 2C:
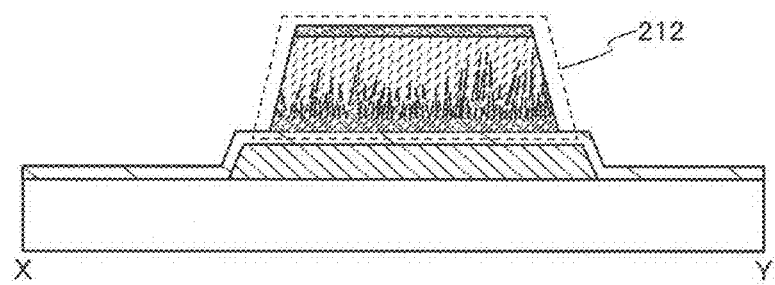

Next, the first semiconductor film 206, the second semiconductor film 208, and the impurity semiconductor film 210 are etched using the etching mask 211, so that the thin film stack 212 is formed (FIG. 2C).

Note that as described above, it is preferable to perform insulation treatment to make the side surfaces of the thin film stack 212 have an insulating property. That is because the off-state current increases when the first semiconductor layer and the second conductive layer of the completed transistor are in contact with each other in many cases. Here, for the insulation treatment, the side surfaces of the thin film stack 212 may be exposed to oxygen plasma or nitrogen plasma.

Alternatively, the insulation treatment may be performed as follows: an insulating film is formed while the side surfaces of the thin film stack 212 are exposed, and the insulating film is etched in the direction perpendicular to a surface of the substrate 200 by a method for etching with high anisotropy, so that side wall insulating layers are formed in contact with the side surfaces of the thin film stack 212.

Figure 2D:
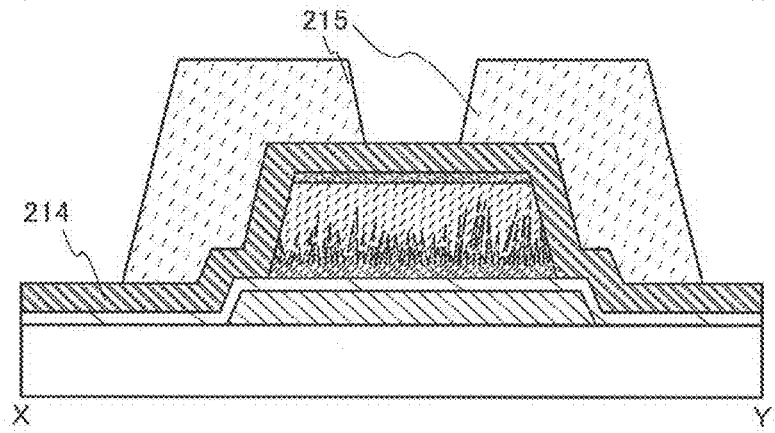

Next, a conductive film 214 is formed over the first insulating layer 204 and the thin film stack 212. An etching mask 215 is formed over the conductive film 214 (FIG. 2D). The etching mask 215 may be formed of a resist material.

The conductive film 214 may be formed of a conductive material (e.g., metal or a semiconductor to which an impurity element imparting one conductivity type is added) in a manner similar to that of the first conductive layer 202. Note that the conductive film 214 may have a single-layer structure or a layered structure including plural layers. For example, the conductive film 214 may be formed to have a three-layer structure in which an Al layer is sandwiched between Ti layers.

Figure 3A:
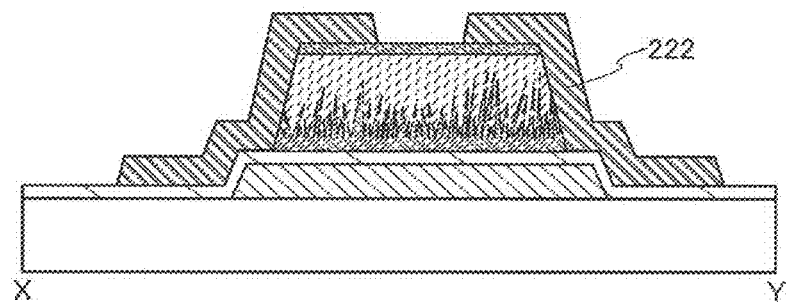
FIGS. 3A to 3D illustrate the method for manufacturing the semiconductor device of one embodiment of the present invention.

Next, the conductive film 214 is etched with the use of the etching mask 215, so that a second conductive layer 222 is formed (FIG. 3A). Then, the etching mask 215 is removed. Note that the second conductive layer 222 forms at least a signal line, and source and drain electrodes.

Figure 3B:
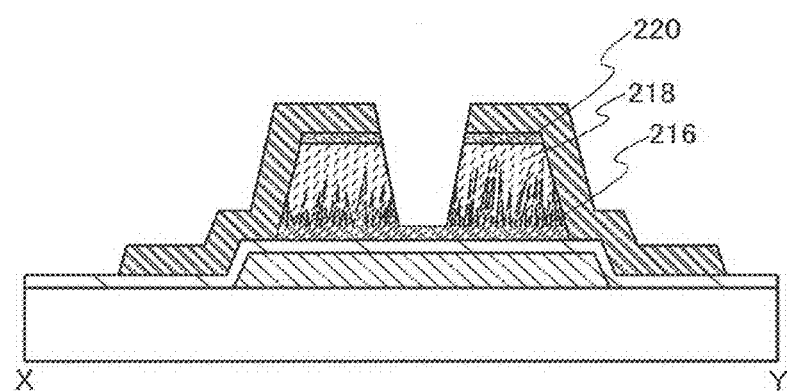

Next, the thin film stack 212 is etched using the second conductive layer 222 as an etching mask. Here, etching is performed with the use of a mixed gas of a Br-based gas, a F-based gas, and an oxygen gas. With the use of the mixed gas of a Br-based gas, a F-based gas, and an oxygen gas, the etching rate of the crystalline semiconductor film can be made small and the etching rate of the amorphous semiconductor film can be made large. In other words, when the first semiconductor film 206 is a crystalline semiconductor film and the second semiconductor film 208 is an amorphous semiconductor film, high etching selectivity can be obtained between a layer formed using the first semiconductor film 206 and a layer formed using the second semiconductor film 208. Even in the case where part of the second semiconductor film 208 which does not overlap with the second conductive layer 222 is removed and part of the layer formed using the first semiconductor film 206 which does not overlap with the second conductive layer 222 is exposed, reduction in the film thickness of part of the first semiconductor layer 216 which does not overlap with the second conductive layer 222 can be suppressed (FIG. 3B).

Note that bias power of the etching with the use of the mixed gas may be greater than 0 W and less than or equal to 100 W. At this time, the area of an electrode is preferably more than or equal to 340 $cm^2$.

Note that as the Br-based gas, a HBr gas can be given, for example.

Note that as the F-based gas, a $SF_6$ gas, a $CF_4$ gas, or a $NF_3$ gas can be given, for example.

Note that the flow rate of a HBr gas, a $SF_6$ gas, and an oxygen gas is preferably 25:2:1.

Note that the etching using the mixed gas is preferably performed with the use of the etching mask 215.

Then, the above-described exposed first semiconductor layer 216 is preferably exposed to $H_2O$ plasma. Alternatively, plasma generated by a mixed gas of hydrogen and oxygen may be used instead of $H_2O$ plasma.

Through the above steps, the transistor can be manufactured. Such a transistor can be applied to a pixel transistor used in a pixel of a display device.

Figure 3C:
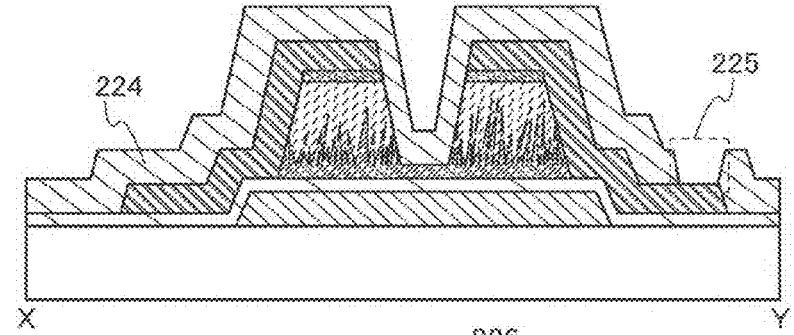

Then, a second insulating layer 224 is formed so as to cover these layers. Note that the second insulating layer 224 is formed so as to cover at least the exposed portion of the first semiconductor layer 216. Then, an opening portion 225 is formed in the second insulating layer 224 (FIG. 3C).

An etching mask is formed over the second insulating layer 224 and etching is performed, so that the opening portion 225 is formed.

Next, a third conductive layer 226 is regioselectively formed so as to be electrically connected to one of the source and drain electrodes formed using the second conductive layer 222 through the opening portion 225.

When the third conductive layer 226 forms a pixel electrode connected to the pixel transistor, the third conductive layer 226 is preferably formed of a light-transmitting material. A conductive film is formed over the second insulating layer 224, an etching mask is formed over the conductive film, and etching is performed thereon, so that the third conductive layer 226 is formed.

The third conductive layer 226 can be formed using a conductive composition containing a conductive high molecule (also referred to as a conductive polymer) having a light-transmitting property. It is preferable that the third conductive layer 226 formed using the conductive composition have a sheet resistance of less than or equal to 10000 Ω/square and a light transmittance of greater than or equal to 70% at a wavelength of 550 nm. Further, the resistivity of the conductive high molecule included in the conductive composition is preferably less than or equal to 0.1 Ω·cm.

As the conductive high molecular, a "π electron conjugated conductive high molecular" can be used. For example, polyaniline or a derivative thereof, polypyrrole or a derivative thereof, polythiophene or a derivative thereof, and a copolymer of two or more of aniline, pyrrole, and thiophene or a derivative thereof can be given.

The third conductive layer 226 can be formed using, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

The third conductive layer 226 may be formed by processing a film that is formed using the above-described material by a photolithography method.

When the third conductive layer 226 is formed of a light-transmitting material, the third conductive layer 226 can function as a pixel electrode of a transmissive display device.

Although not shown, an insulating layer formed of an organic resin by a spin coating method or the like may be provided between the second insulating layer 224 and the third conductive layer 226.

Note that the above-described thin film transistor in this embodiment is a preferable one embodiment but one embodiment of the present invention is not limited thereto. For example, the first semiconductor film 206 is not necessarily a microcrystalline semiconductor film and the second semiconductor film 208 does not necessarily include a minute semiconductor crystal grain.

Figure 3D:
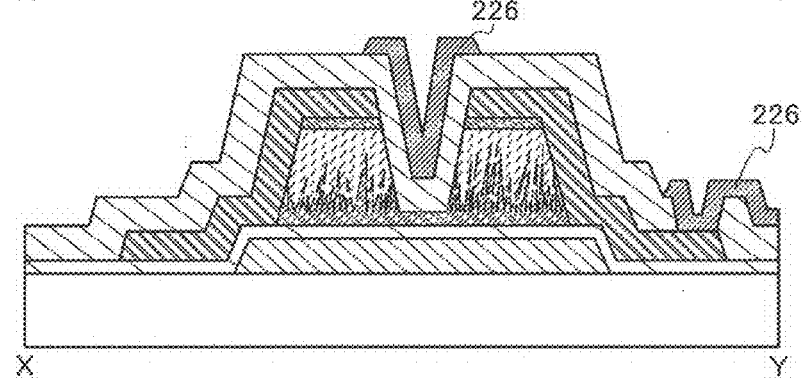

As described above, the thin film transistor illustrated in FIG. 3D can be manufactured while reduction in the film thickness of the first semiconductor layer 216 is suppressed. Consequently, a thin film transistor with favorable electric characteristics (e.g., low off-state current) can be manufactured.

Embodiment 3

In this embodiment, a semiconductor device that is one embodiment of the present invention will be described with reference to the drawings.

In a thin-film transistor of this embodiment, an "additional gate electrode (hereinafter also referred to as a second gate electrode)" is provided on the side opposite to a gate electrode (hereinafter also referred to as a first gate electrode) and a channel formation region is increased by the additional gate electrode. Thus, an additional gate electrode is provided, on-state current can be increased.

Figure 4A:
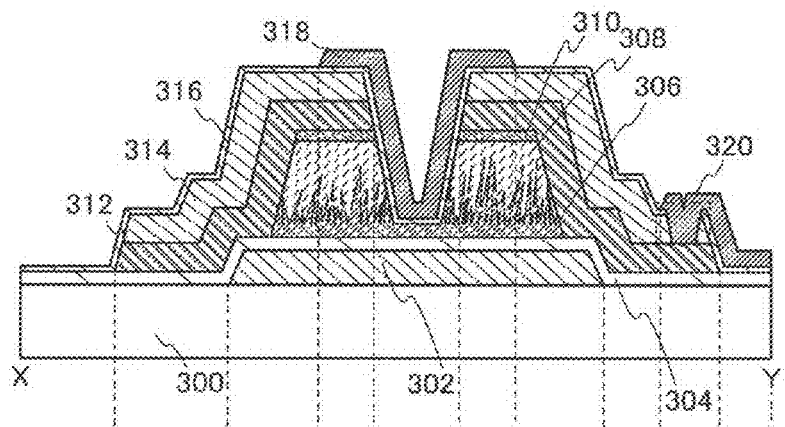
FIGS. 4A to 4C are a cross-sectional view and top views illustrating a semiconductor device of one embodiment of the present invention.
Figure 4B:
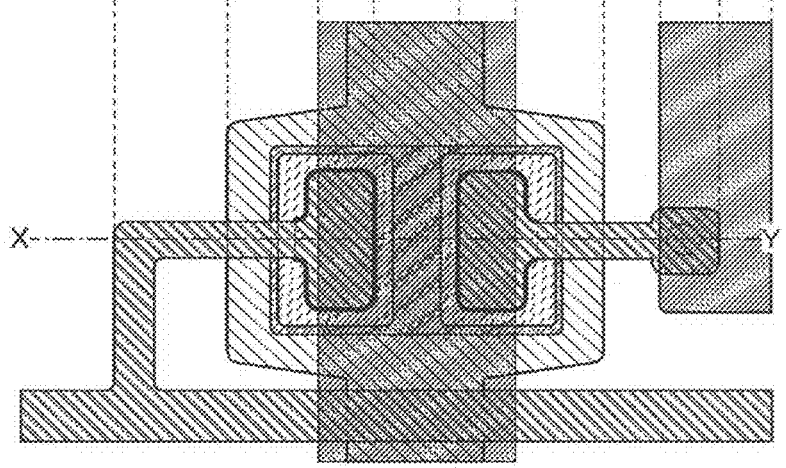
Figure 4C:
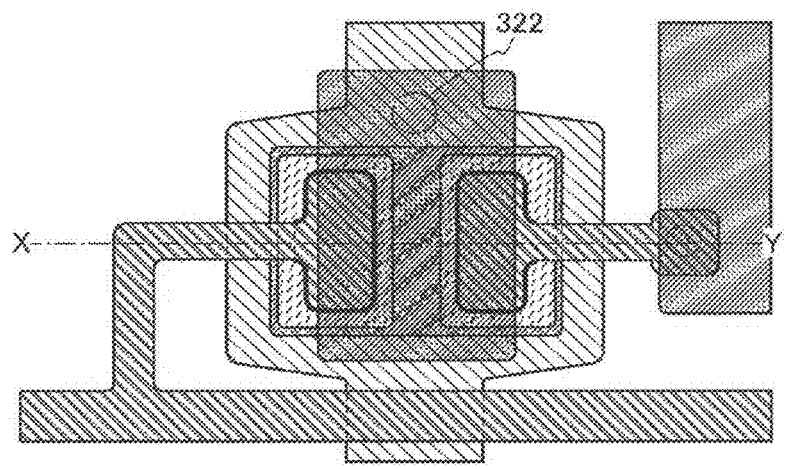

FIGS. 4A, 4B, and 4C are a cross-sectional view and top views illustrating semiconductor devices that are an embodiment of the present invention. FIG. 4A is a cross sectional view along the line X-Y in the top view of FIG. 4B. The semiconductor device illustrated in FIGS. 4A and 4B includes a first conductive layer 302 provided over a substrate 300, a first insulating layer 304 covering the first conductive layer 302, a first semiconductor layer 306 provided over the first insulating layer 304, second semiconductor layers 308 which are spaced from each other to expose part of the first semiconductor layer 306, an impurity semiconductor layer 310 provided over the second semiconductor layers 308, a second conductive layer 312 provided over the impurity semiconductor layer 310 to be partially in contact with a surface of the impurity semiconductor layer 310, a second insulating layer 314 provided only over the second conductive layer 312, a third insulating layer 316 provided to cover the first semiconductor layer 306, the second semiconductor layers 308, the impurity semiconductor layer 310, the second conductive layer 312, and the second insulating layer 314, and a third conductive layer 318 provided at least over the third insulating layer 316. The second conductive layer 312 and the third conductive layer 318 are connected in an opening portion 320.

Here, the third conductive layer 318 overlaps with a portion of the first semiconductor layer 306, which does not overlap with the second semiconductor layers 308, and also overlaps with part of the second conductive layer 312.

FIG. 4B illustrates a mode in which a gate formed using the third conductive layer 318 is formed independently of a gate formed using the first conductive layer 302. At this time, the potential of the gate formed using the third conductive layer 318 can be different from the potential of the gate formed using the first conductive layer 302. Thus, the threshold voltage of the thin film transistor can be controlled. Note that the semiconductor device of this embodiment is not limited to this mode, and a mode illustrated in FIG. 4C may also be employed.

FIG. 4C illustrates a mode in which the gate formed of the third conductive layer 318 is connected to the gate formed of the first conductive layer 302 in an opening portion 322. At this time, the potential of the gate formed of the third conductive layer 318 is equal to the potential of the gate formed of the first conductive layer 302.

Note that the first insulating layer 304, the second insulating layer 314, and the third insulating layer 316 are preferably silicon nitride films.

Note that the first insulating layer 304, the second insulating layer 314, and the third insulating layer 316 are not limited to silicon nitride layers. Further, these layers may be a layered structure including a plurality of layers. For example, the second insulating layer 314 may have a two-layer structure in which a silicon oxynitride layer is stacked over a silicon nitride layer, or may have a three-layer structure in which a silicon oxynitride layer is stacked over a silicon oxide layer, and a silicon nitride layer is stacked over the silicon oxynitride layer. In such a manner, using a silicon oxide layer or a silicon oxynitride layer as the second insulating layer 314, the second insulating layer 314 can be thinner than the case where a silicon nitride layer is used. This is because the silicon oxide layer and the silicon oxynitride layer have lower relative dielectric constant than the silicon nitride layer.

Note that the gate formed of the third conductive layer 318 is not limited to the mode shown in FIGS. 4A to 4C. The gate formed of the third conductive layer 318 may have a gate electrode and a gate wiring in different layers. The gate electrode formed of the third conductive layer 318 and the gate wiring formed of another conductive layer which is formed over an insulating layer provided over the third conductive layer 318 may be used.

Further, only the gate may be formed using the third conductive layer 318, and a pixel electrode formed using a different conductive layer from the third conductive layer 318 may be provided.

In the semiconductor illustrated in FIGS. 4A to 4C, field-effect mobility and on-state current can be high.

Figure 5A:
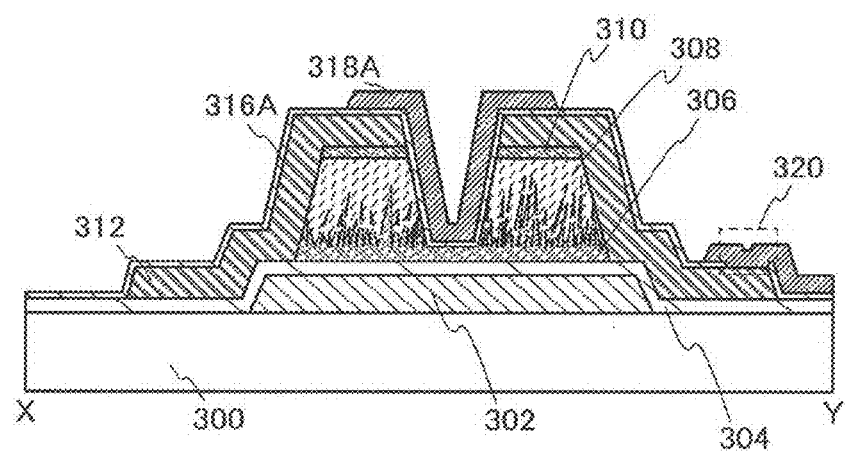
FIGS. 5A and 5B are cross-sectional views of a semiconductor device shown as comparative examples of FIGS. 4A to 4C.

A semiconductor device illustrated in FIG. 5A is a comparative example of the semiconductor device illustrated in FIGS. 4A to 4C. The semiconductor device illustrated in FIG. 5A is widely different from the semiconductor device in FIGS. 4A to 4C in that the second insulating layer is not provided, and the first semiconductor layer 306, the second semiconductor layer 308, the impurity semiconductor layer 310, a third insulating layer 316A provided to cover the impurity semiconductor layer 310 and the second conductive layer 312, and a third conductive layer 318A formed at least over the third insulating layer 316A are included. Note that the third insulating layer 316A is formed with the same thickness as the third insulating layer 316 in FIG. 4A.

The semiconductor device illustrated in FIG. 5A can have high field-effect mobility and high on-state current as the semiconductor device illustrated in FIG. 4A. However, there is a problem in that unintended capacitance (parasitic capacitance) becomes larger than that of the semiconductor device shown in FIG. 4A because only the third insulating layer 316A is interposed between the second conductive layer 312 and the third conductive layer 318A, which partially overlap with each other.

Figure 5B:
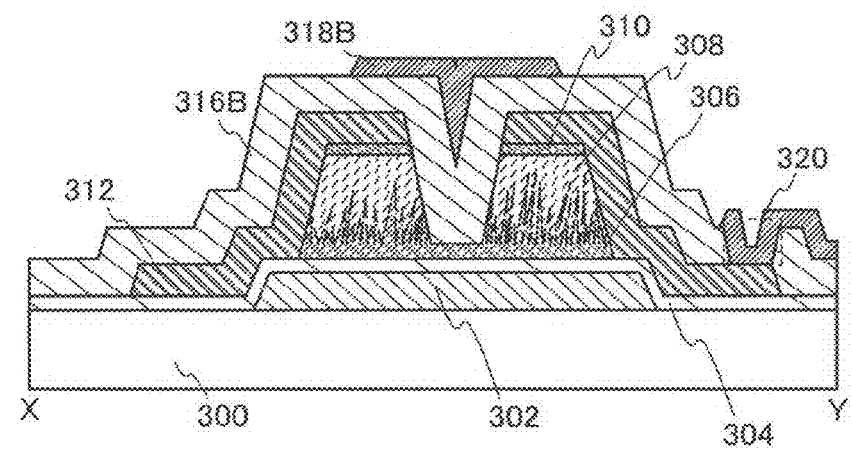

A semiconductor device illustrated in FIG. 5B is a comparative example of the semiconductor device shown in FIGS. 4A to 4C. The semiconductor device illustrated in FIG. 5B is widely different from the semiconductor device illustrated in FIGS. 4A to 4C in that the second insulating layer is not provided, and the first semiconductor layer 306, the second semiconductor layers 308, the impurity semiconductor layer 310, a third insulating layer 316B provided to cover the impurity semiconductor layer 310 and the second conductive layer 312, and a third conductive layer 318B formed at least over the third insulating layer 316B are included. Note that the third insulating layer 316B is formed with the same thickness as the total thickness of the second insulating layer 314 and the third insulating layer 316 in FIG. 4A.

The semiconductor device shown in FIG. 5B can have smaller parasitic capacitance than that of the semiconductor device shown in FIG. 5A. However, the third insulating layer 316B having the same thickness as total thickness of the second insulating layer 314 and the third insulating layer 316 in FIG. 4A is interposed between the second conductive layer 312 and the third conductive layer 318B, which partially overlap with each other, whereby electric field generated in the gate provided using the third conductive layer 318B is weak and it is difficult to improve field-effect mobility of the thin film transistor and to increase on-state current.

By providing the second insulating layer 314 illustrated in FIG. 4A with a large thickness, a semiconductor device with small parasitic capacitance, high field-effect mobility, and high on-state current can be provided.

Here, a method for manufacturing the semiconductor device described with reference to FIGS. 4A to 4C will be described with reference to FIGS. 6A to 6C, FIGS. 7A to 7C, and FIGS. 8A to 8C.

Note that in the following description of the method for manufacturing the semiconductor device with reference to FIGS. 6A to 6C, FIGS. 7A to 7C, and FIGS. 8A to 8C, a substrate 400 corresponds to the substrate 300 in FIGS. 4A to 4C. A first conductive layer 402 corresponds to the first conductive layer 302 in FIGS. 4A to 4C. A first insulating layer 404 corresponds to the first insulating layer 304 in FIGS. 4A to 4C. A first semiconductor layer 422 corresponds to the first semiconductor layer 306 in FIGS. 4A to 4C. A second semiconductor layer 424 corresponds to the second semiconductor layers 308 in FIGS. 4A to 4C. An impurity semiconductor layer 426 corresponds to the impurity semiconductor layer 310 in FIGS. 4A to 4C. A second conductive layer 420 corresponds to the second conductive layer 312 in FIGS. 4A to 4C. A second insulating layer 418 corresponds to the second insulating layer 314 in FIGS. 4A to 4C. A third insulating layer 428 corresponds to the third insulating layer 316 in FIGS. 4A to 4C. A third conductive layer 430 corresponds to the third conductive layer 318 in FIGS. 4A to 4C. An opening portion 429 corresponds to the opening portion 320 in FIGS. 4A to 4C.

Figure 6A:
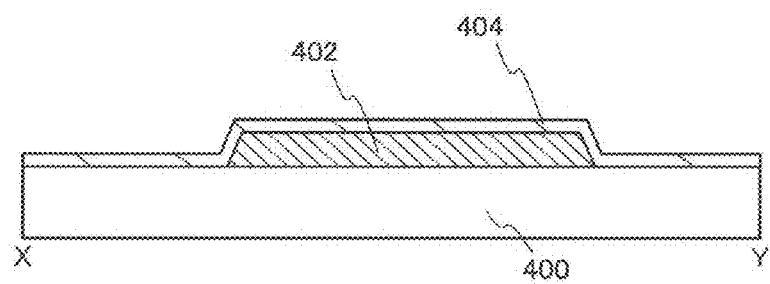
FIGS. 6A to 6C illustrate a method for manufacturing a semiconductor device of one embodiment of the present invention.

First, the first conductive layer 402 is formed over the substrate 400, and the first insulating layer 404 is formed so as to cover the first conductive layer 402 (FIG. 6A).

The substrate 400 corresponds to the substrate 200 in Embodiment 1.

The first conductive layer 402 corresponds to the first conductive layer 202 in Embodiment 1.

The first insulating layer 404 corresponds to the first insulating layer 204 in Embodiment 1.

Note that here, the surface of the first insulating layer 404 is preferably exposed to plasma generated by a $N_2O$ gas in a manner similar to that in Embodiment 1. Here, the gas generating plasma is not limited to the $N_2O$ gas, and may be a gas which can oxidize the surface of the first insulating layer 404 (an oxidizing gas or a gas containing oxygen).

Figure 6B:
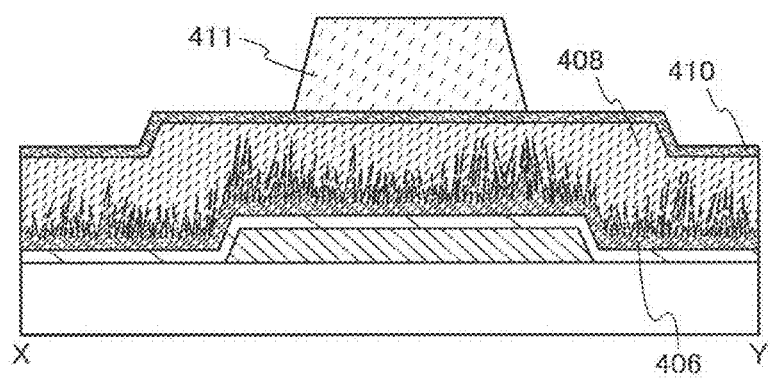

Next, a first semiconductor film 406, a second semiconductor film 408, and an impurity semiconductor film 410 are stacked in this order over the first insulating layer 404, and an etching mask 411 is formed over the impurity semiconductor film 410 (FIG. 6B). The etching mask 411 may be formed of a resist material.

The first semiconductor film 406 corresponds to the first semiconductor film 206 in Embodiment 1.

The second semiconductor film 408 corresponds to the second semiconductor film 208 in Embodiment 1.

The impurity semiconductor film 410 corresponds to the impurity semiconductor film 210 in Embodiment 1.

Note that it is preferable that formation of the first insulating layer 404 up to the impurity semiconductor film 410 be performed in the same chamber in succession. This is to prevent impurities from entering an interface between layers from the first insulating layer 404 to the impurity semiconductor film 410.

Figure 6C:
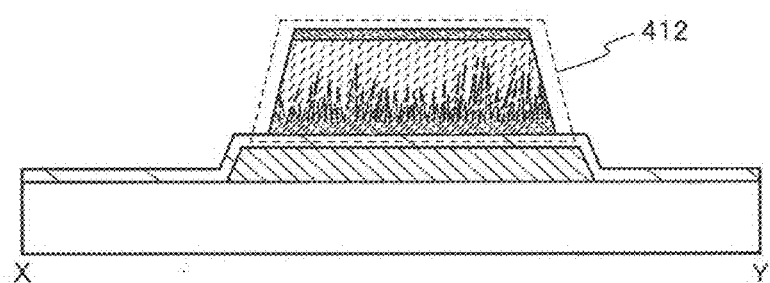

Next, using the etching mask 411, the first semiconductor film 406, the second semiconductor film 408, and the impurity semiconductor film 410 are etched, so that the thin film stack 412 is formed (FIG. 6C).

Note that it is preferable to perform insulation treatment to make the side surfaces of the thin film stack 412 in a manner similar to that in Embodiment 1.

Figure 7A:
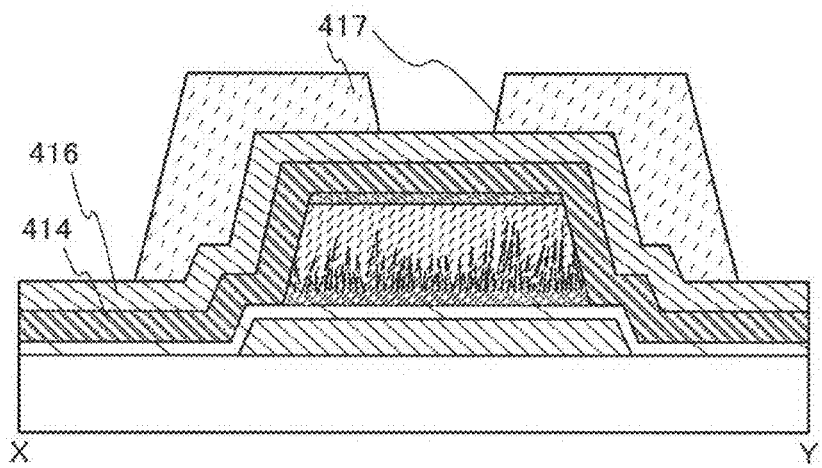
FIGS. 7A to 7C illustrate the method for manufacturing the semiconductor device of one embodiment of the present invention.

Next, a conductive film 414 and an insulating film 416 are formed over the first insulating layer 404 and the thin film stack 412, and an etching mask 417 is formed on the insulating film 416 (FIG. 7A). The etching mask 417 may be formed of a resist material.

The conductive film 414 may be formed of a conductive material (e.g., metal or a semiconductor to which an impurity element imparting one conductivity type is added) in a manner similar to that of the first conductive layer 402. Note that the conductive film 414 may have a single-layer structure or a layered structure including plural layers. A stacked structure of three layers in which an Al layer is interposed between Ti layers is employed here, for example.

Figure 7B:
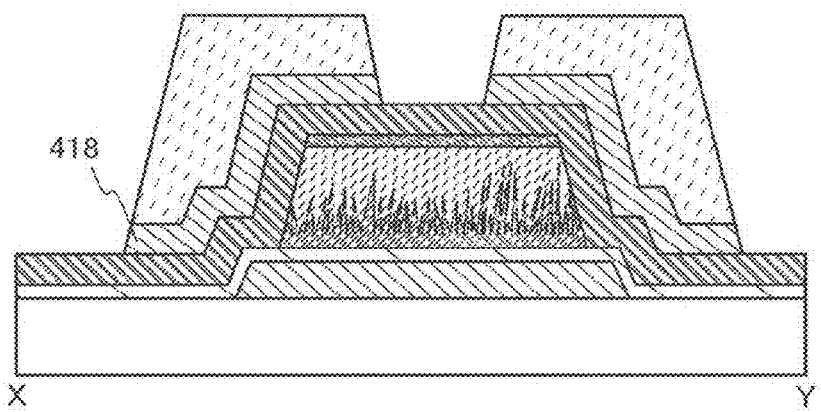

The insulating film 416 may be formed of an insulating material which is similar to that of the first insulating layer 404. In addition, the insulating film 416 may have a single layer structure or a layered structure including a plurality of layers. Here, the insulating film 416 may be formed of silicon nitride, for example Then, the insulating film 416 is etched using the etching mask 417, whereby the second insulating layer 418 is formed (FIG. 7B).

Figure 7C:
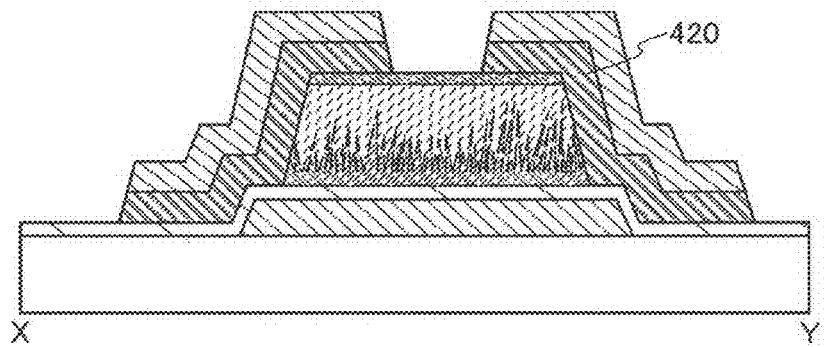

Next, the conductive film 414 is etched, so that the second conductive layer 420 is formed (FIG. 7C). Then, the etching mask 417 is removed. Note that the second conductive layer 420 forms at least a signal line, and source and drain electrodes.

Note that a step of etching the insulating film 416 (a step of processing the insulating film 416 from the state in FIG. 6A to the state in FIG. 6B) and a step of etching the conductive film 414 (a step of processing the conductive film 414 from the state in FIG. 6B to the state in FIG. 6C) are preferably performed in the same etching process for simplification of a manufacturing process.

Note that the conductive film 414 may be etched using the second insulating layer 418 as an etching mask. At this time, before etching the conductive film 414 to form the second conductive layer 420, the etching mask 417 may be removed.

Note that when the conductive film 414 is etched to form the second conductive layer 420, an upper portion of the thin film stack 412 is etched in many cases.

Figure 8A:
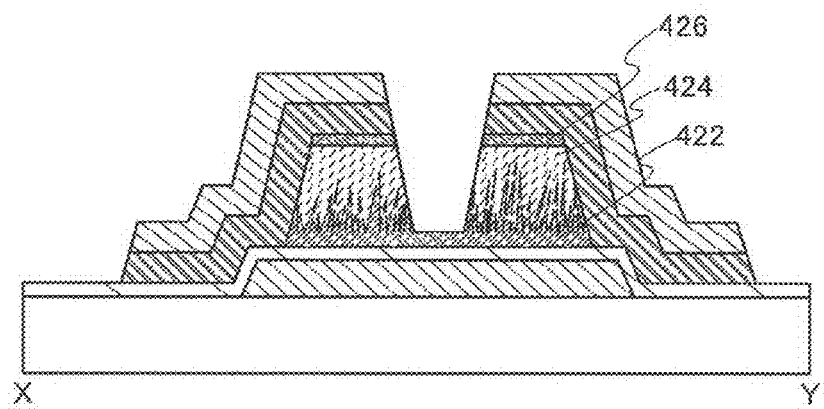
FIGS. 8A to 8C illustrate the method for manufacturing the semiconductor device of one embodiment of the present invention.

Next, the upper portion of the thin film stack 412 is etched so that the first semiconductor layer 422, the second semiconductor layer 424, and impurity semiconductor layer 426 are formed (FIG. 8A). The etching of the thin film stack 412 may be performed in one step or plural steps. The etching is performed until a portion of the first semiconductor layer 422 (that is, a portion to be a channel formation region), which does not overlap with the second semiconductor layer 424, is exposed.

Figure 8B:
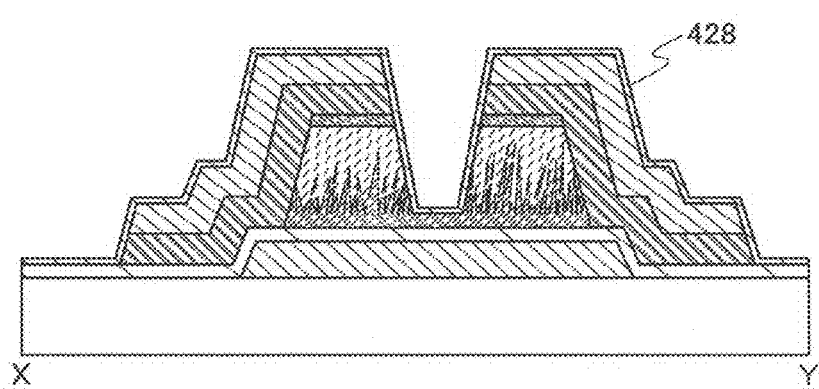

The etching using a mixed gas of a Br-based gas, a F-based gas, and an oxygen gas is performed until the portion of the first semiconductor layer 422, (that is, the portion to be a channel formation region) which does not overlap with the second semiconductor layer 424, is exposed. With the use of the mixed gas of a Br-based gas, a F-based gas, and an oxygen gas, the etching rate of the crystalline semiconductor film can be made small and the etching rate of the amorphous semiconductor film can be made large. In other words, when the first semiconductor film 406 is a crystalline semiconductor film and the second semiconductor film 408 is an amorphous semiconductor film, high etching selectivity can be obtained between a layer formed using the first semiconductor film 406 and a layer formed using the second semiconductor film 408. Even in the case where part of the second semiconductor film 408 which does not overlap with the second conductive layer 420 is removed and part of the layer formed using the first semiconductor film 406 which does not overlap with the second conductive layer 420 is exposed, reduction in the film thickness of part of the first semiconductor layer 422 which does not overlap with the second conductive layer 420 can be suppressed (FIG. 8B). Further, off-current of the thin film transistor can be reduced.

Note that bias power of the etching with the use of the mixed gas may be greater than 0 W and less than or equal to 100 W. At this time, the area of an electrode is preferably more than or equal to 340 cm$^2$.

Note that as the Br-based gas, a HBr gas can be given, for example.

Note that as the F-based gas, a $SF_6$ gas, a $CF_4$ gas, or a $NF_3$ gas can be given, for example.

Note that the flow rate of a HBr gas, a $SF_6$ gas, and an oxygen gas is preferably 25:2:1.

The step of etching the conductive film 414 to form the second conductive layer 420 and the step of etching the upper portion of the thin film stack 412 to form the first semiconductor layer 422, the second semiconductor layer 424, and the impurity semiconductor layer 426 may be performed at the same time as one step.

Then, the above-described exposed first semiconductor layer 422 is preferably exposed to $H_2O$ plasma. Alternatively, plasma generated by a mixed gas of hydrogen and oxygen may be used instead of $H_2O$ plasma.

Through the above steps, the transistor can be manufactured. Such a transistor can be applied to a pixel transistor used in a pixel of a display device.

Then, a third insulating layer 428 is formed so as to cover these layers. Note that the third insulating layer 428 is formed so as to cover at least the exposed portion of the first semiconductor layer 422. Then, an opening portion 429 is formed in the third insulating layer 428 (FIG. 8B).

The third insulating layer 428 corresponds to the second insulating layer 224 in Embodiment 1.

Figure 8C:
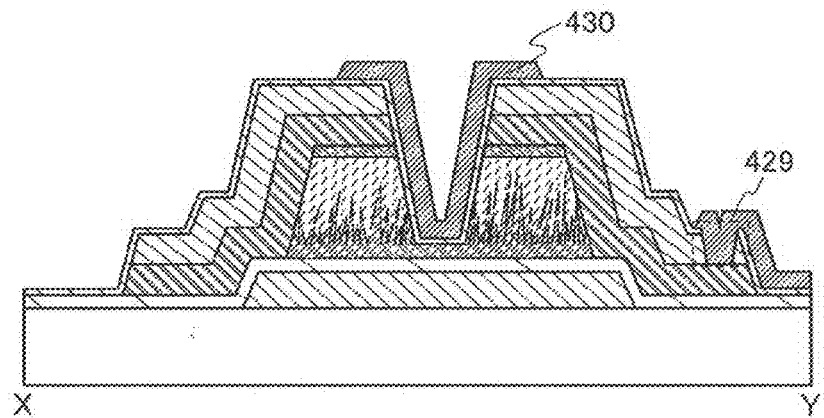

Next, a third conductive layer 430 is regioselectively formed so as to be electrically connected to one of the source and drain electrodes formed using the second conductive layer 420 through the opening portion 429 (FIG. 8C).

The third conductive layer 430 corresponds to the third conductive layer 226 in Embodiment 1.

When the third conductive layer 430 is formed of a light-transmitting material, the third conductive layer 430 can function as a pixel electrode of a transmissive display device.

Although not shown, an insulating layer formed of an organic resin by a spin coating method or the like may be provided between the third insulating layer 428 and the third conductive layer 430.

Note that as the second conductive layer 420 (the conductive film 414), it is preferable to employ a structure in which an Al layer is interposed between Ti layers. This is because wiring resistance can be reduced by the Al layer and the Ti layers can function as barrier layers.

However, unlike in the structure which is not provided with the second insulating layer 418 and a Ti layer is provided on the upper side of the second conductive layer 420, when a $CF_4$ gas is used in the etching performed until the portion of the first semiconductor layer 422 (that is, the portion to be a channel formation region), which does not overlap with the second semiconductor layers 424, is exposed, a by-product is generated from the Ti layer on the upper side of the second conductive layer 420, so that the contact resistance of the third conductive layer 430 in an opening portion is considerably increased. A scanning transmission electron microscopy (STEM) image of the opening portion 429 in the state where the by-products is generated is shown in FIGS. 20A and 20B.

Figure 20A:
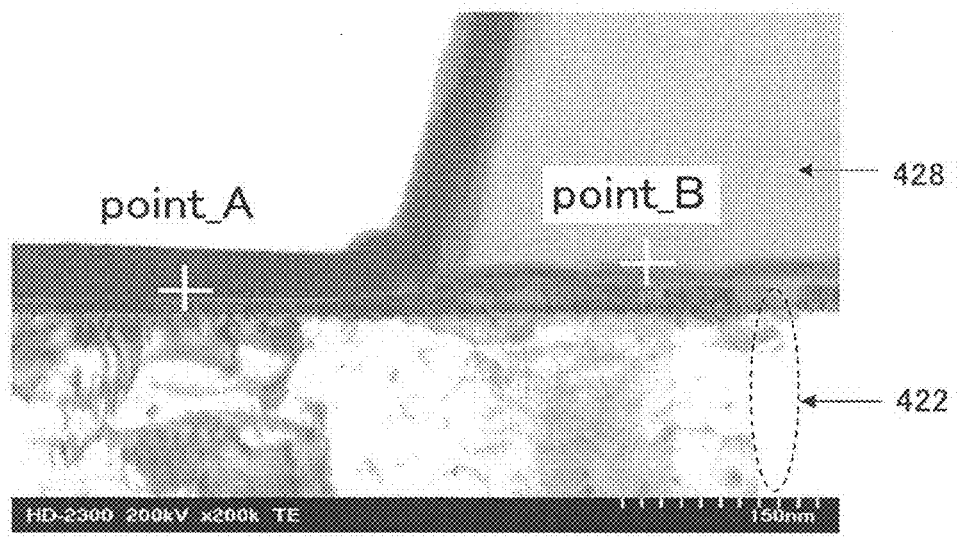
FIGS. 20A and 20B are STEM images of Comparative Sample described in Embodiment 3.
Figure 20B:
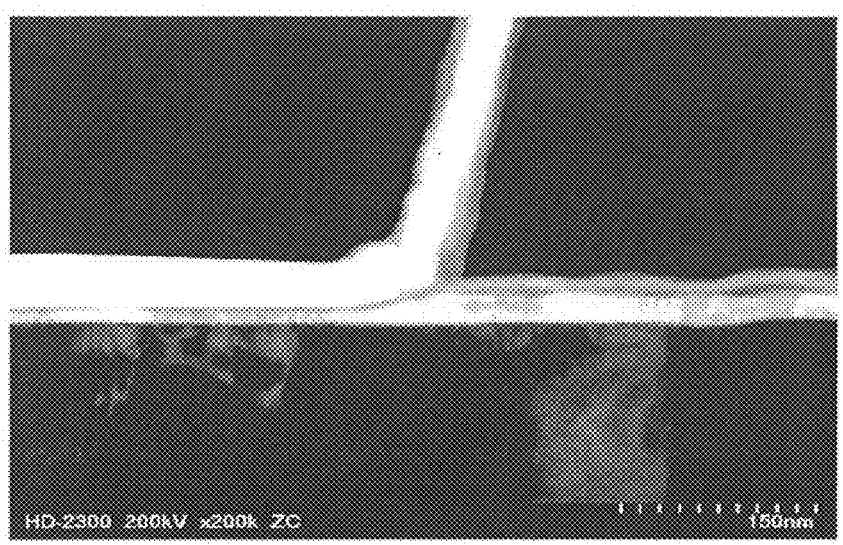

FIG. 20A shows a bright-field image of the STEM image and FIG. 20B shows a dark-field image (a Z contrast image) of the STEM image. As shown in FIGS. 20A and 20B, the Ti layer on the upper side of the second conductive layer 420 is not almost planar but includes a by-product.

Figure 21A:
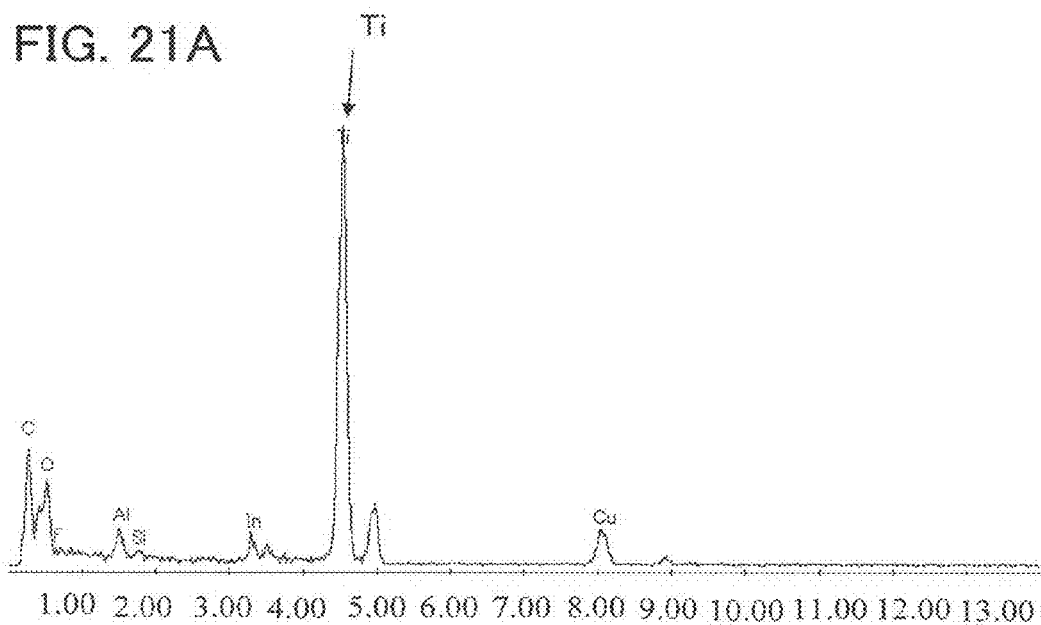
FIGS. 21A and 21B are EDX spectra obtained from observed regions in FIG. 20A.
Figure 21B:
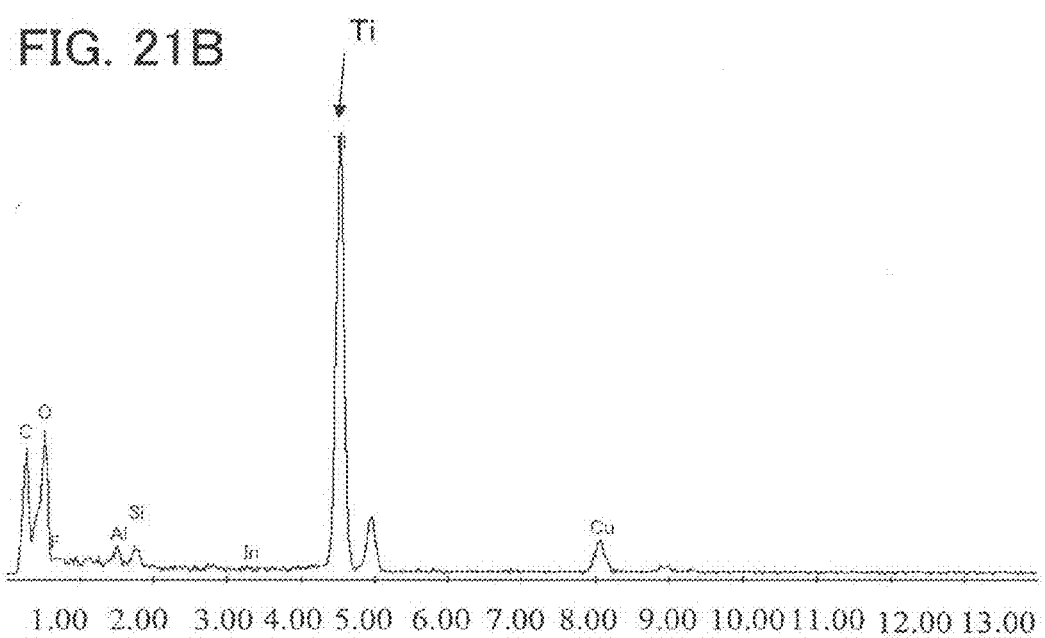

FIG. 21A shows an EDX spectrum obtained at a point_A shown in FIG. 20A. FIG. 21B shows an EDX spectrum obtained at a point_B shown in FIG. 20A. As shown in FIG. 21B, it is found that the main component of this by-product is Ti.

A two-layer structure in which an Al layer is provided over a Ti layer may be employed as the second conductive layer 420 (the conductive film 414). However, in the case where the third conductive layer 430 is an ITO layer, when a layer exposed in the opening portion 429 is an Al layer, the Al layer is in contact with the ITO layer, so that electrochemical corrosion is generated, which is generally known. Consequently, the contact resistance in the opening portion is also considerably increased in that case.

In view of the above, the second insulating layer 418 is provided so that generation of a by-product from the Ti layer on the upper side of the second conductive layer 420 can be efficiently prevented and the contact resistance between the second conductive layer 420 and the third conductive layer 430 in the thin film transistor can be decreased.

Note that the second conductive layer 420 is connected to the third conductive layer 430 in the opening portion 429. Further, the first conductive layer 402 and the third conductive layer 430 are connected to each other in the opening portion 431. Here, formation methods of the opening portion 429 and the opening portion 431 are described with reference to FIGS. 9A-1, 9A-2, 9B-1, 9B-2, 9C-1, and 9C-2.

The opening portion 429 and the opening portion 431 may be formed by a single etching step or a plurality of etching steps.

Figures 1, 9B:
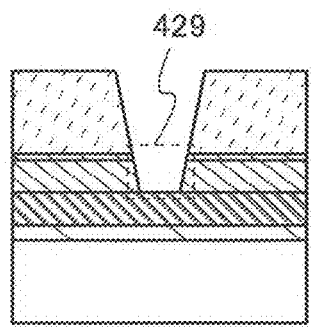
Figures 2, 9B:
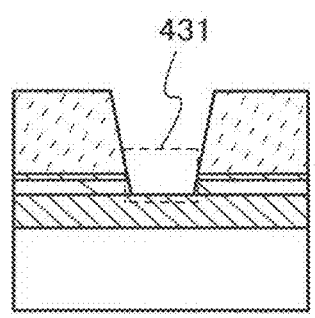
Figures 1, 9C:
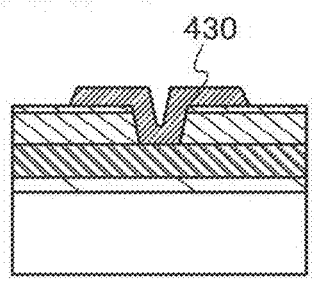
Figures 2, 9C:
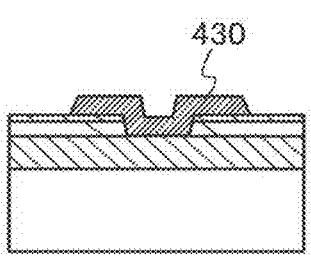

FIGS. 9A-1 to 9C-1 illustrate a formation method of the opening portion 429, and FIGS. 9A-2 to 9C-2 illustrate a formation method of the opening portion 431.

First, an etching mask 440 is formed over portions other than the portions where the opening portion 429 and the opening portion 431 are formed (FIGS. 9A-1 and 9A-2).

In the portion where the opening portion 429 is formed, the first insulating layer 404, the second conductive layer 420, the second insulating layer 418, and the third insulating layer 428 are provided over the substrate 400. On the other hand, in the portion where the opening portion 431 is formed, the first conductive layer 402, the first insulating layer 404, and the third insulating layer 428 are provided over the substrate 400.

Next, the opening portion 431 is formed by etching the first insulating layer 404 and the third insulating layer 428 at the same time as the formation of the opening portion 429 by etching the second insulating layer 418 and the third insulating layer 428 using the etching mask 440 (FIGS. 9B-1 and 9B-2).

Next, the third conductive layer 430 is formed over each of the opening portion 429 and the opening portion 431 (FIGS. 9C-1 and 9C-2).

Further, as illustrated in FIGS. 10A-1, 10A-2, 10B-1, 10B-2, 10C-1, 10C-2, 10D-1, and 10D-2, the opening portion 429 and the opening portion 431 may be formed by two-step etching process.

FIGS. 10A-1, 10B-1, 10C-1, and 10D-1 illustrate a formation method of the opening portion 429 by the two-step etching process, and FIGS. 10A-2, 10B-2, 10C-2, and 10D-2 illustrate a formation method of the opening portion 431 by the two-step etching process.

Figures 1, 10A:
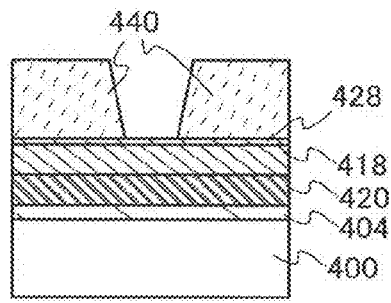
Figures 2, 10A:
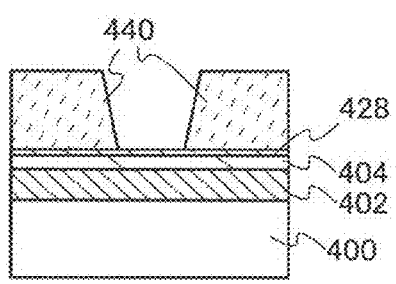

First, the etching mask 440 is formed over portions other than the portions where the opening portion 429 and the opening portion 431 are formed (FIGS. 10A-1 and 10A-2). As in the case with FIGS. 9A-1, 9A-2, 9B-1, 9B-2, 9C-1, and 9C-2, in the portion where the opening portion 429 is formed, the first insulating layer 404, the second conductive layer 420, the second insulating layer 418, and the third insulating layer 428 are formed over the substrate 400. On the other hand, in the portion where the opening portion 431 is formed, the first conductive layer 402, the first insulating layer 404, and the third insulating layer 428 are provided over the substrate 400.

Figures 1, 10B:
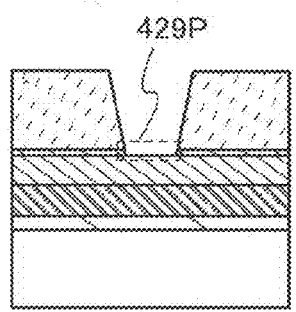
Figures 2, 10B:
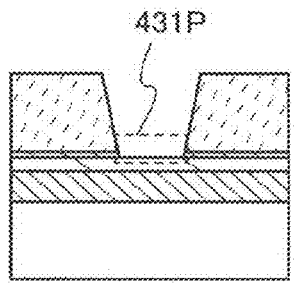

Next, the third insulating layer 428 is etched using the etching mask 440, whereby an opening portion 429P and an opening portion 431P are formed (FIG. 10B-1 and FIG. 10B-2).

Figures 1, 10C:
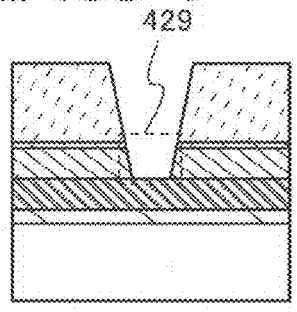
Figures 2, 10C:
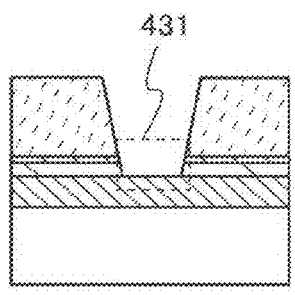

Next, the opening portion 431 is formed by etching the first insulating layer 404 in a portion of the opening portion 431P at the same time as the formation of the opening portion 429 by etching the second insulating layer 418 in a portion of the opening portion 429P (FIGS. 10C-1 and 10C-2).

Figures 1, 10D:
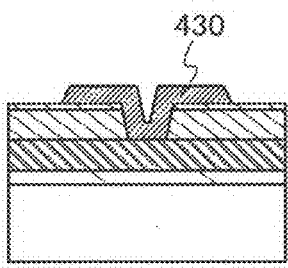
Figures 2, 10D:
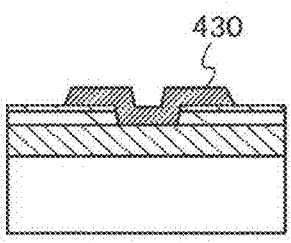

Subsequently, the third conductive layer 430 is formed in each of the opening portion 429 and the opening portion 431 (FIGS. 10D-1 and 10D-2).

As described above, the opening portion 429 and the opening portion 431 can be formed.

Embodiment 4

The thin film transistors described in Embodiments 2 and 3 are provided with the third conductive layer 226 and the third conductive layer 430 respectively so as to overlap with the channel formation regions. The third conductive layer 226 functions as a back gate electrode. In this embodiment, a method for providing a back gate electrode for a thin film transistor will be described.

FIGS. 11A to 11D each illustrate a top view of a thin film transistor provided with a back gate electrode. Note that a cross-sectional structure of the thin film transistor is similar to that in Embodiment 2.

Figure 11A:
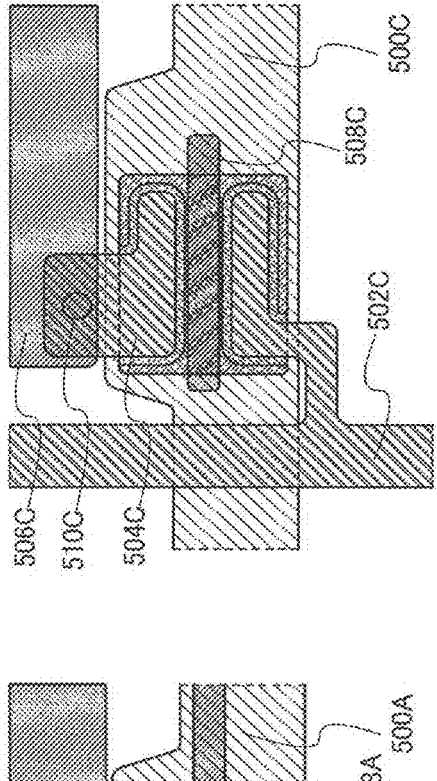
FIGS. 11A to 11D each illustrate a semiconductor device of one embodiment of the present invention.

First, as illustrated in FIG. 11A, a back gate 508A can be formed so as not to be electrically connected to a gate 500A but to be provided electrically independently. By arranging the back gate 508A as illustrated in FIG. HA, a potential supplied to the back gate 508A and a potential supplied to the gate 500A can be controlled to be independent from each other. Thus, the threshold voltage of the thin film transistor can be controlled. Further, a region where carriers flow is formed in both of the gate 500A side and the back gate 508A side of a channel formation region including a first semiconductor layer, so that on-state current of the thin film transistor can be increased.

Note that the gate 500A illustrated in FIG. 11A is a gate electrode and a gate wiring and is formed using the first conductive layer 202 in Embodiment 2.

Note that a wiring 502A illustrated in FIG. 11A is a source electrode and a source wiring and is formed using the second conductive layer 222 in Embodiment 2.

Note that an electrode 504A illustrated in FIG. 11A is a drain electrode and is formed using the second conductive layer 222 in Embodiment 2.

Note that a pixel electrode 506A illustrated in FIG. 11A is a pixel electrode and is formed using the third conductive layer 226 in Embodiment 2.

Note that the back gate 508A illustrated in FIG. 11A is a back gate electrode and a back gate wiring and formed using the third conductive layer 226 in Embodiment 2.

Note that an opening portion 510A illustrated in FIG. 11A corresponds to the opening portion 225 in Embodiment 2.

Figure 11C:
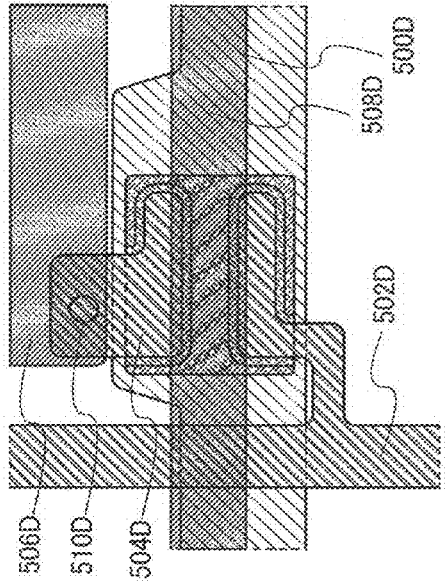
Figure 11B:
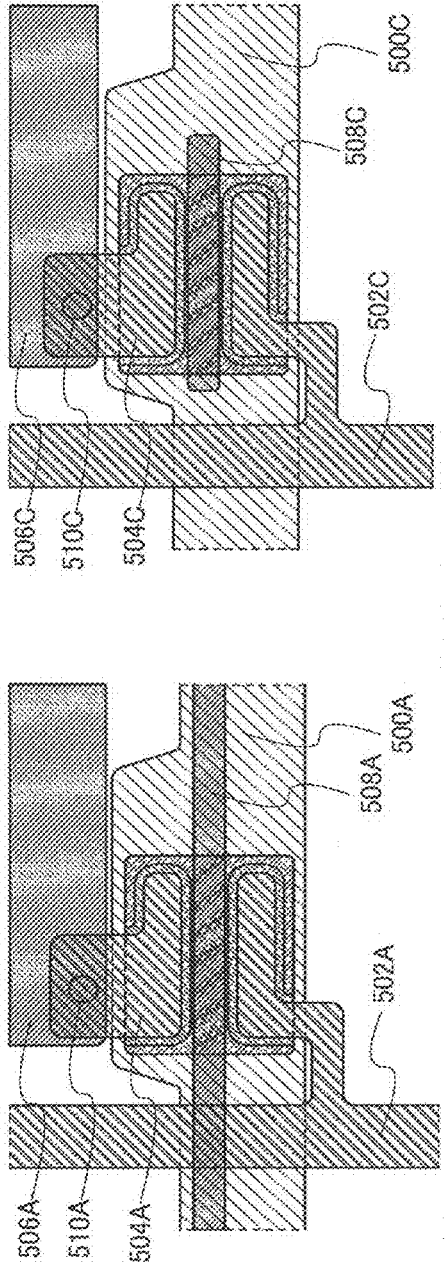

As illustrated in FIG. 11B, a back gate may be electrically connected to a gate. In FIG. 11B, a gate 500B is electrically connected to a back gate 508B in an opening portion 512. Thus, the potential of the gate 500B is substantially equal to the potential of the back gate 508B. Consequently, similarly to FIG. 11A, a region where carriers flow is formed in both of the gate 500B side and the back gate 508B side of a channel formation region including a first semiconductor layer, so that on-state current of the thin film transistor can be increased.

Note that the gate 500B illustrated in FIG. 11B is a gate electrode and a gate wiring and is formed using the first conductive layer 202 in Embodiment 2.

Note that a wiring 502B illustrated in FIG. 11B is a source electrode and a source wiring and is formed using the second conductive layer 222 in Embodiment 2.

Note that an electrode 504B illustrated in FIG. 11B is a drain electrode and is formed using the second conductive layer 222 in Embodiment 2.

Note that a pixel electrode 506B illustrated in FIG. 11B is a pixel electrode and is formed using the third conductive layer 226 in Embodiment 2.

Note that the back gate 508B illustrated in FIG. 11B is a back gate electrode and formed using the third conductive layer 226 in Embodiment 2.

Note that an opening portion 510B illustrated in FIG. 11B corresponds to the opening portion 225 in Embodiment 2.

Note that the opening portion 512 illustrated in FIG. 11B is formed in the same step as the step of the opening portion 225 in Embodiment 2. In the opening portion 512, the gate 500B and the back gate 508B are connected with each other.

As illustrated in FIG. 11C, a back gate may be in a floating state without electrically connecting to a gate electrode and without leading independently.

Note that the gate 500C illustrated in FIG. 11C is a gate electrode and a gate wiring and is formed using the first conductive layer 202 in Embodiment 2.

Note that a wiring 502C illustrated in FIG. 11C is a source electrode and a source wiring and is formed using the second conductive layer 222 in Embodiment 2.

Note that an electrode 504C illustrated in FIG. 11C is a drain electrode and is formed using the second conductive layer 222 in Embodiment 2.

Note that a pixel electrode 506C illustrated in FIG. 11C is a pixel electrode and is formed using the third conductive layer 226 in Embodiment 2.

Note that the back gate 508C illustrated in FIG. 11C is a back gate electrode and formed using the third conductive layer 226 in Embodiment 2.

Note that an opening portion 510C illustrated in FIG. 11C corresponds to the opening portion 225 in Embodiment 2.

Figure 11D:
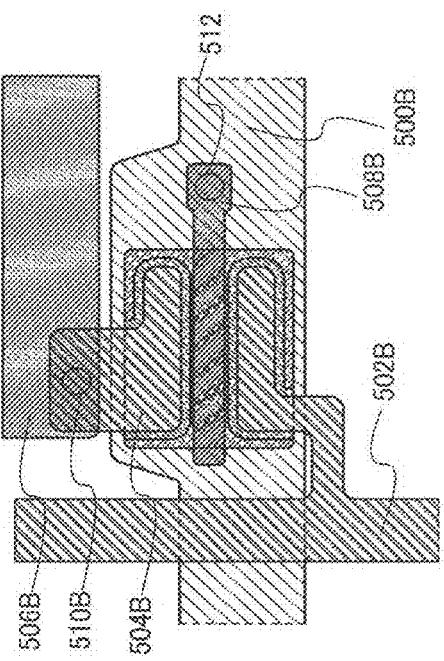

As illustrated in FIG. 11D, a back gate may be provided so as to overlap with a source electrode and a drain electrode. Here, a thin film transistor having the structure illustrated in FIG. 11A is described; however, the back gates illustrated in FIGS. 11B and 11C may each overlap with a source electrode and a drain electrode formed using the second conductive layer 222 in a manner similar to that in FIG. 11A.

Note that the gate 500D illustrated in FIG. 11D is a gate electrode and a gate wiring and is formed using the first conductive layer 202 in Embodiment 2.

Note that a wiring 502D illustrated in FIG. 11D is a source electrode and a source wiring and is formed using the second conductive layer 222 in Embodiment 2.

Note that an electrode 504D illustrated in FIG. 11D is a drain electrode and is formed using the second conductive layer 222 in Embodiment 2.

Note that a pixel electrode 506D illustrated in FIG. 11D is a pixel electrode and is formed using the third conductive layer 226 in Embodiment 2.

Note that the back gate 508D illustrated in FIG. 11D is a back gate electrode and a back gate wiring and formed using the third conductive layer 226 in Embodiment 2.

Note that an opening portion 510D illustrated in FIG. 11D corresponds to the opening portion 225 in Embodiment 2.

Embodiment 5

As a semiconductor device to which the thin film transistor manufactured in any of Embodiments 2 to 4 is applied, electronic paper can be given. Electronic paper can be used for electronic appliances of a variety of fields as long as they can display data. For example, electronic paper can be applied to an electronic book reader (e-book), a poster, a digital signage, a public information display (PID), an advertisement in a vehicle such as a train, displays of various cards such as a credit card, and the like. Examples of such electronic devices are illustrated in FIG. 12.

Figure 12:
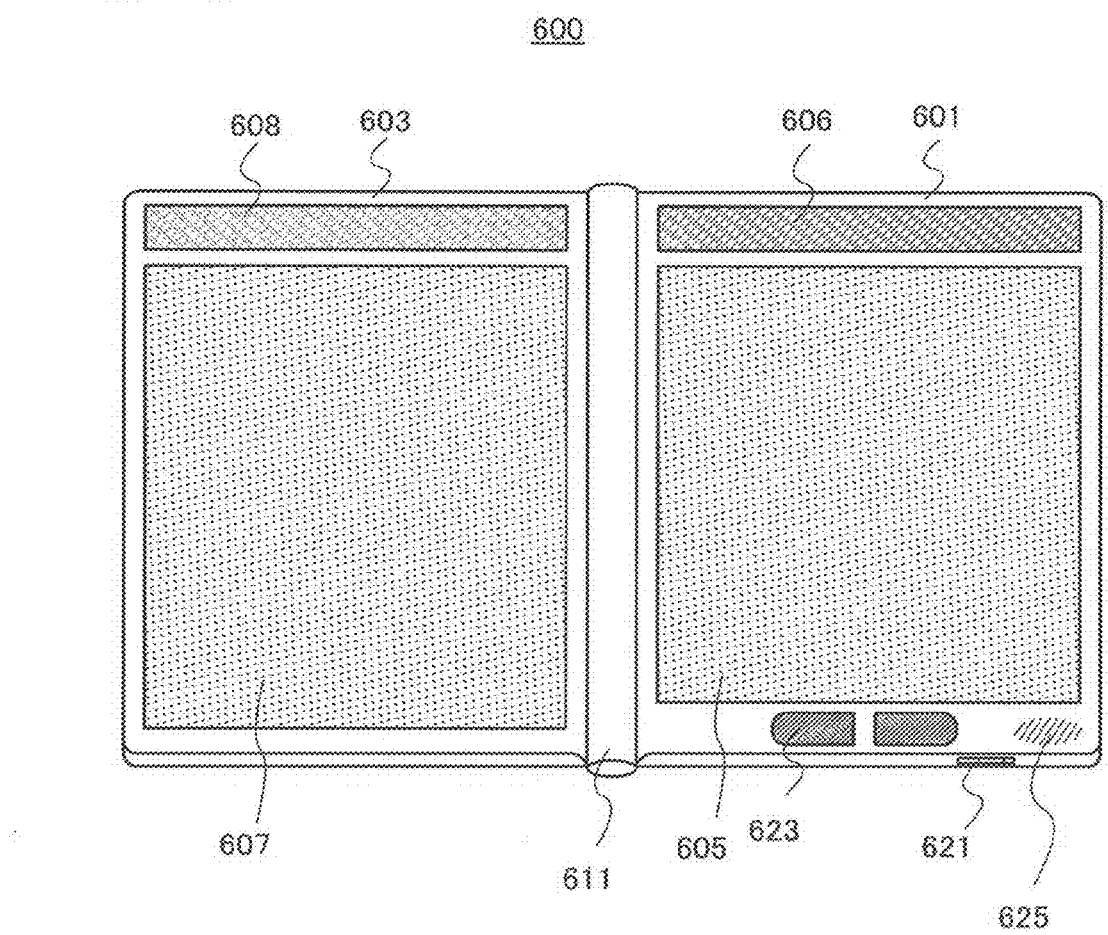
FIG. 12 illustrates a semiconductor device of one embodiment of the present invention.

FIG. 12 illustrates an example of an e-book reader. For example, an e-book reader 600 includes two housings 601 and 603. The housings 601 and 603 are combined with each other with a hinge 611 so that the e-book reader 600 can be opened and closed with the hinge 611 as an axis. With such a structure, the e-book reader 600 can be handled like a paper book.

A display portion 605 and a photoelectric conversion device 606 are incorporated in the housing 601. A display portion 607 and a photoelectric conversion device 608 are incorporated in the housing 603. The display portions 605 and 607 may display one image or different images. In the case where the display portion 605 and 607 display different images, for example, a display portion on the right side (the display portion 605 in FIG. 12) can display text and a display portion on the left side (the display portion 607 in FIG. 12) can display images.

FIG. 12 illustrates an example in which the housing 601 includes an operation portion and the like. For example, the housing 601 includes a power source 621, operation keys 623, a speaker 625, and the like. Pages can be turned by the operation keys 623. Note that a keyboard, a pointing device, or the like may also be provided on the surface of the housing, on which the display portion is provided. Furthermore, an external connection terminal (an earphone terminal, a USB terminal, a terminal that can be connected to an AC adapter, various cables such as a USB cable, or the like), a recording medium insertion portion, and the like may be provided on the back surface or the side surface of the housing. Furthermore, the e-book reader 600 may function as an electronic dictionary.

Further, the e-book reader 600 may transmit and receive data wirelessly. Through wireless communication, desired book data or the like can be purchased and downloaded from an electronic book server.

Embodiment 6

As the semiconductor device to which the thin film transistor manufactured in any of Embodiments 2 to 4 is applied, various electronic appliances (including amusement machines) can be given, in addition to electronic paper. Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 13A:
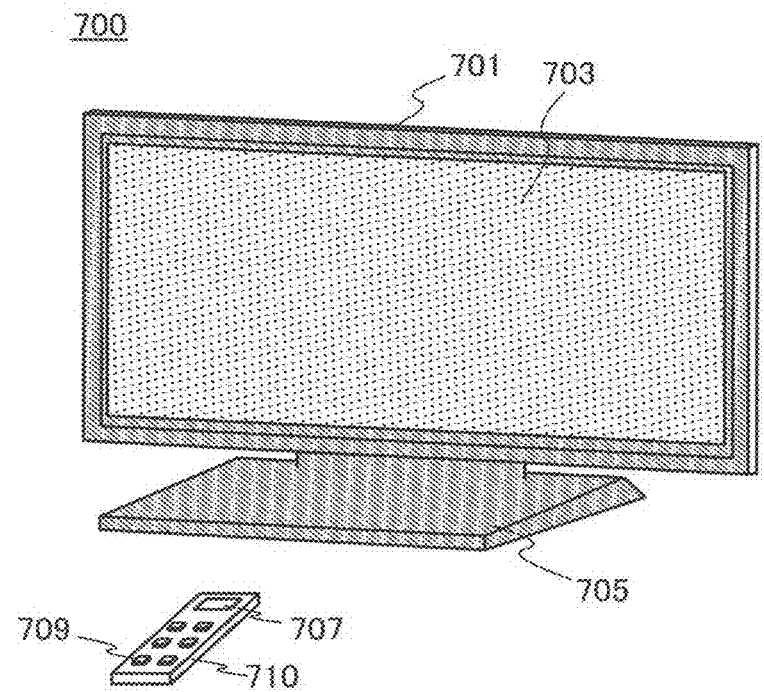
FIGS. 13A and 13B illustrate a semiconductor device of one embodiment of the present invention.

FIG. 13A illustrates an example of a television set. In the television set 700, a display portion 703 is incorporated in a housing 701. Images can be displayed on the display portion 703. Here, the housing 701 is supported by a stand 705.

The television set 700 can be operated by an operation switch of the housing 701 or a separate remote controller 710. Channels can be switched and volume can be controlled with operation keys 709 of the remote controller 710, whereby an image displayed on the display portion 703 can be controlled. The remote controller 710 may be provided with a display portion 707 for displaying data output from the remote controller 710.

Note that the television set 700 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 13B:
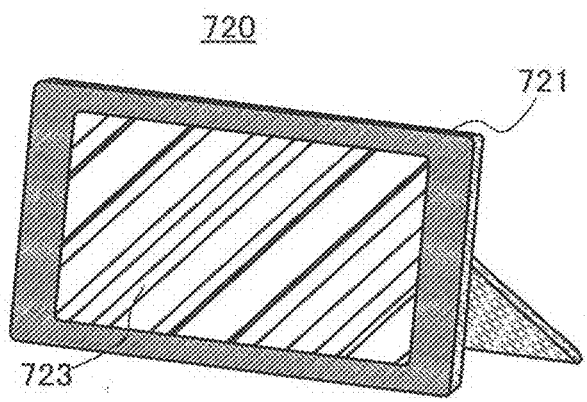

FIG. 13B illustrates an example of a digital photo frame. For example, a display portion 723 is incorporated in a housing 721 of the digital photo frame 720. The display portion 723 can display a variety of images. For example, the display portion 723 can display data of an image taken with a digital camera or the like and function as a normal photo frame Note that the digital photo frame 720 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 720. For example, a storage medium having image data taken with a digital camera is inserted into the storage medium inserting portion of the digital photo frame and the image data is imported, whereby the imported image data can be displayed on the display portion 723.

The digital photo frame 720 may have a structure capable of wirelessly transmitting and receiving data. The structure may be employed in which desired image data is transferred wirelessly to be displayed.

Figure 14:
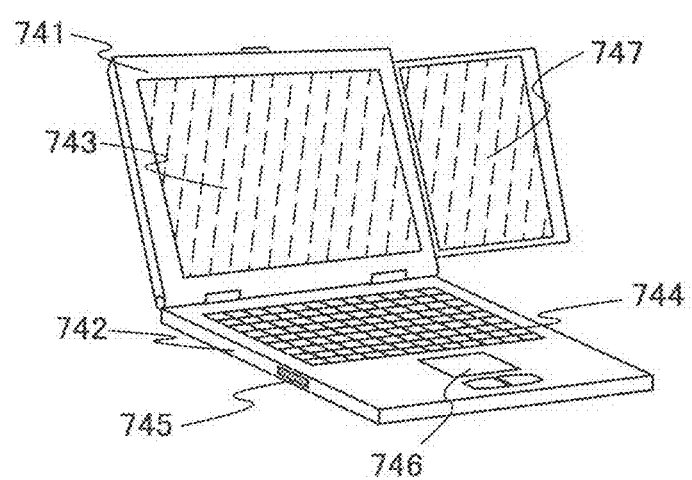
FIG. 14 illustrates a semiconductor device of one embodiment of the present invention.

FIG. 14 is a perspective view illustrating an example of a portable computer.

In the portable computer of FIG. 14, a top housing 741 having a display portion 743 and a bottom housing 742 having a keyboard 744 can overlap with each other by closing a hinge unit which connects the top housing 741 and the bottom housing 742. The portable computer of FIG. 14 can be convenient for carrying, and in the case of using the keyboard for input, the hinge unit is opened and the user can input looking at the display portion 743.

The bottom housing 742 includes a pointing device 746 with which input can be performed, in addition to the keyboard 744. When the display portion 743 is a touch input panel, input can be performed by touching part of the display portion 743. The bottom housing 742 includes an arithmetic function portion such as a CPU or hard disk. In addition, the lower housing 742 includes an external connection port 745 into which another device, for example, a communication cable based on communication standards of a USB is inserted.

The top housing 741 further includes a display portion 747 which can be kept in the top housing 741 by being slid therein. Thus, a large display screen can be realized. In addition, the user can adjust the orientation of a screen of the display portion 747 which can be kept in the top housing 741. When the display portion 747 which can be kept in the top housing 741 is a touch input panel, input can be performed by touching part of the display portion 747 which can be kept in the top housing 741.

The display portion 743 or the display portion 747 which can be kept in the top housing 741 is formed with an image display device of a liquid crystal display panel, a light-emitting display panel such as an organic light-emitting element or an inorganic light-emitting element, or the like.

In addition, the portable computer illustrated in FIG. 14 can include a receiver and the like and can receive a TV broadcast to display images on the display portion. The user can watch a television broadcast when the whole screen of the display portion 747 is exposed by sliding the display portion 747 while the hinge unit which connects the top housing 741 and the bottom housing 742 is kept closed. In this case, the hinge unit is not opened and display is not performed on the display portion 743. In addition, start up of only a circuit for displaying television broadcast is performed. Therefore, power can be consumed to the minimum, which is useful for the portable computer whose battery capacity is limited.

EXAMPLE 1

In this example, description is made on that the etching selectivity of an amorphous semiconductor film to a crystalline semiconductor film can be high with the method for etching of one embodiment of the present invention.

In this example, a semiconductor film (an amorphous semiconductor film or a microcrystalline semiconductor film) was formed over a substrate, a pattern was formed over the semiconductor film with the use of a resist mask, a half etching was performed thereon, and then the resist mask was removed. The etched film was measured with a step profiler, whereby an etching rate was obtained. Note that six Samples A to F were manufactured as samples.

Note that a microcrystalline silicon film was used as the crystalline semiconductor film and an amorphous silicon film was used as the amorphous semiconductor film.

Here, the microcrystalline silicon film was formed through two-step film formation process. Through the two-step film formation process, a 5-nm-thick microcrystalline silicon film was formed at the first stage and a 65-nm-thick microcrystalline silicon film was formed at the second stage. Specifically, at the first stage, a monosilane gas, an argon gas, and a hydrogen gas were introduced at 4 sccm, 750 sccm, and 750 sccm respectively into a reaction chamber where the substrate was placed; the pressure in the reaction chamber was set at 532 Pa; the distance between an upper electrode and a lower electrode in the reaction chamber was set at 15 mm; and high-frequency power with a frequency of 13.56 MHz and electrical power of 150 W was supplied to the upper electrode. Note that the temperature of the upper electrode was set at 200° C. and the temperature of the lower electrode was set at 300° C. At the second stage, a monosilane gas, an argon gas, and a hydrogen gas were introduced at 0.3 sccm, 750 sccm, and 750 sccm respectively into a reaction chamber where the substrate was placed; the pressure in the reaction chamber was set at 5000 Pa; the distance between the upper electrode and the lower electrode in the reaction chamber was set at 15 mm; and high-frequency power with a frequency of 13.56 MHz and electrical power of 250 W was supplied to the upper electrode. Note that the temperature of the upper electrode was set at 200° C. and the temperature of the lower electrode was set at 300° C.

The amorphous silicon film was formed under the following conditions: a monosilane gas, an ammonia gas diluted with hydrogen, an argon gas, and hydrogen gas were introduced at 25 sccm, 100 sccm, 750 sccm, and 650 sccm respectively into a reaction chamber where the substrate was placed; the pressure in the reaction chamber was 1250 Pa; the distance between the upper electrode and the lower electrode in the reaction chamber was 15 mm; and high-frequency power with a frequency of 13.56 MHz and electrical power of 150 W was supplied to the upper electrode. Note that the temperature of the upper electrode was set at 200° C. and the temperature of the lower electrode was set at 300° C.

A pattern was formed over the amorphous semiconductor film formed in this manner, with the use of a resist mask, a half etching was performed thereon, and then the resist mask was removed. Then, the etched film was measured with a step profiler, whereby an etching rate was obtained.

As for Sample A, a substrate over which an amorphous silicon film was formed was introduced into a reaction chamber, a boron trichloride ($BCl_3$) gas and a chlorine gas were introduced at 60 sccm and 20 sccm respectively into the reaction chamber where the substrate was placed, the pressure in the reaction chamber was set at 1.9 Pa, high-frequency power with a frequency of 13.56 MHz and electrical power of 450 W was supplied to an upper electrode, and bias power between the upper electrode and a lower electrode was set at 100 W. Note that the temperature of the upper electrode was set at 100° C. and the temperature of the lower electrode was set at 70° C.

As for Sample B, a substrate over which a microcrystalline silicon film was formed was introduced into a reaction chamber, a boron trichloride ($BCl_3$) gas and a chlorine gas were introduced at 60 sccm and 20 sccm respectively into the reaction chamber where the substrate was placed, the pressure in the reaction chamber was set at 1.9 Pa, high-frequency power with a frequency of 13.56 MHz and electrical power of 450 W was supplied to an upper electrode, and bias power between the upper electrode and a lower electrode was set at 100 W. Note that the temperature of the upper electrode was set at 100° C. and the temperature of the lower electrode was set at 70° C.

At that time, the etching rate of the amorphous silicon film of Sample A and the etching rate of the microcrystalline silicon film of Sample B were 160.90 nm/min. and was 158.60 nm/min. respectively. Therefore, the etching selectivity of the amorphous silicon film to the microcrystalline silicon film was 1.01.

As for Sample C, a substrate over which an amorphous silicon film was formed was introduced into a reaction chamber, a $CF_4$ gas was introduced at 100 sccm into the reaction chamber where the substrate was placed, the pressure in the reaction chamber was set at 0.67 Pa, the distance between an upper electrode and a lower electrode in the reaction chamber was set at 200 mm, high-frequency power of 1000 W was supplied to the upper electrode, and bias power was set at 50 W. Note that the temperature of the lower electrode was set at 40° C.

As for Sample D, a substrate over which a microcrystalline silicon film was formed was introduced into a reaction chamber, a $CF_4$ gas was introduced at 100 sccm into the reaction chamber where the substrate was placed, the pressure in the reaction chamber was set at 0.67 Pa, the distance between an upper electrode and a lower electrode in the reaction chamber was set at 200 mm, high-frequency power of 1000 W was supplied to the upper electrode, and bias power was set at 50 W. Note that the temperature of the lower electrode was set at 40° C.

At that time, the etching rate of the amorphous silicon film of Sample C and the etching rate of the microcrystalline silicon film of Sample D were 66.56 nm/min. and was 79.33 nm/min. respectively. Therefore, the etching selectivity of the amorphous silicon film to the microcrystalline silicon film was 0.84.

As for Sample E, a substrate over which an amorphous silicon film was formed was introduced into a reaction chamber, a HBr gas, a $SF_6$ gas, and an oxygen gas were introduced at 125 sccm, 10 sccm, and 5 sccm respectively into the reaction chamber where the substrate was placed, the pressure in the reaction chamber was set at 1.7 Pa, high-frequency power with a frequency of 13.56 MHz and electrical power of 500 W was supplied to an upper electrode, and bias power between the upper electrode and a lower electrode was set at 50 W. Note that the temperature of the upper electrode was set at 100° C. and the temperature of the lower electrode was set at 70° C.

As for Sample F, a substrate over which a microcrystalline silicon film was formed was introduced into a reaction chamber, a HBr gas, a $SF_6$ gas, and an oxygen gas were introduced at 125 sccm, 10 sccm, and 5 sccm respectively into the reaction chamber where the substrate was placed, the pressure in the reaction chamber was set at 1.7 Pa, high-frequency power with a frequency of 13.56 MHz and electrical power of 500 W was supplied to an upper electrode, and bias power between the upper electrode and a lower electrode was set at 50 W. Note that the temperature of the upper electrode was set at 100° C. and the temperature of the lower electrode was set at 70° C.

At that time, the etching rate of the amorphous silicon film and the etching rate of the microcrystalline silicon film were 189.04 nm/min. and was 125.80 nm/min. respectively. Therefore, the etching selectivity of the amorphous silicon film to the microcrystalline silicon film was 1.50.

As a result, as described in this Example, comparison between etching with the use of a mixed gas of $BCl_3$ gas and a chlorine gas (Sample A and Sample B), etching with the use of $CF_4$ gas (Sample C and Sample D), and etching with the use of a mixed gas of a HBr gas, a $SF_6$ gas, and an oxygen gas (Sample E and Sample F) can result in a finding that the etching selectivity of the etching with the use of a mixed gas of a HBr gas, a $SF_6$ gas, and an oxygen gas (Sample E and Sample F) is the highest.

EXAMPLE 2

In this example, the thin film transistors of Embodiment 2 were manufactured and the characteristics of the thin film transistors were examined and compared. Here, Sample 1, Sample 2, and Comparative Sample 1 were manufactured.

First, a 200-nm-thick base film formed of SiON was formed over a substrate by a plasma CVD method. Next, a conductive film to be the first conductive layer 202 was formed over the base film by a sputtering method and processed, so that the first conductive layer 202 was formed. The first conductive layer 202 had a structure in which a 50-nm-thick Ti layer, a 100-nm-thick Al layer, and a 50-nm-thick Ti layer were stacked.

Next, the 300-nm-thick first insulating layer 204 formed of silicon nitride was formed to cover the first conductive layer 202 by a plasma CVD method. Specifically, a monosilane gas, an ammonia gas, a nitrogen gas, and a hydrogen gas were introduced at 15 sccm, 500 sccm, 180 sccm, and 200 sccm respectively into a reaction chamber where the substrate was placed; the pressure in the reaction chamber was set at 100 Pa; the distance between an upper electrode and a lower electrode in the reaction chamber was set at 26 mm; and high-frequency power with a frequency of 13.56 MHz and electrical power of 200 W was supplied to the upper electrode. Note that the temperature of the upper electrode was set at 200° C. and the temperature of the lower electrode was set at 300° C.

Next, plasma treatment was performed on a surface of the first insulating layer 204. Specifically, a dinitrogen monoxide ($N_2O$) gas was introduced at a flow rate of 400 sccm into a reaction chamber where the substrate was placed, the pressure in the reaction chamber was set at 60 Pa, the distance between an upper electrode and a lower electrode which were provided in the reaction chamber was set at 30 mm, and high-frequency power with a frequency of 13.56 MHz and electrical power of 300 W was supplied to the upper electrode. Note that the temperature of the upper electrode was set at 200° C. and the temperature of the lower electrode was set at 300° C.

Next, the first semiconductor film 206 was formed over the first insulating layer 204 after the plasma treatment. Note that in this example, the first semiconductor film 206 was formed through two-step film formation process. Through the two-step film formation process, a 5-nm-thick microcrystalline silicon film was formed at the first stage and a 65-nm-thick microcrystalline silicon film was formed at the second stage. Specifically, at the first stage, a monosilane gas, an argon gas, and a hydrogen gas were introduced at 4 sccm, 750 sccm, and 750 sccm respectively into a reaction chamber where the substrate was placed; the pressure in the reaction chamber was set at 532 Pa; the distance between an upper electrode and a lower electrode in the reaction chamber was set at 15 mm; and high-frequency power with a frequency of 13.56 MHz and electrical power of 150 W was supplied to the upper electrode. Note that the temperature of the upper electrode was set at 200° C. and the temperature of the lower electrode was set at 300° C. At the second stage, a monosilane gas, an argon gas, and a hydrogen gas were introduced at 0.3 sccm, 750 sccm, and 750 sccm respectively into a reaction chamber where the substrate was placed; the pressure in the reaction chamber was set at 5000 Pa; the distance between the upper electrode and the lower electrode in the reaction chamber was set at 15 mm; and high-frequency power with a frequency of 13.56 MHz and electrical power of 250 W was supplied to the upper electrode. Note that the temperature of the upper electrode was set at 200° C. and the temperature of the lower electrode was set at 300° C.

Next, the 80-nm-thick second semiconductor film 208 was formed over the first semiconductor film 206. Specifically, a monosilane gas, an ammonia gas diluted with hydrogen, an argon gas, and a hydrogen gas were introduced at 25 sccm, 100 sccm, 750 sccm and 650 sccm respectively into a reaction chamber where the substrate was placed; the pressure in the reaction chamber was set at 1250 Pa; the distance between an upper electrode and a lower electrode in the reaction chamber was set at 15 mm; and high-frequency power with a frequency of 13.56 MHz and electrical power of 150 W was supplied to the upper electrode. Note that the temperature of the upper electrode was set at 200° C. and the temperature of the lower electrode was set at 300° C.

Note that here, the ammonia gas diluted with hydrogen is a gas obtained by diluting an ammonia gas with hydrogen to 1000 ppm.

Next, the 50-nm-thick impurity semiconductor film 210 was formed over the second semiconductor film 208. Specifically, a monosilane gas, a phosphine gas diluted with hydrogen, and a hydrogen gas were introduced at 90 sccm, 10 sccm, and 500 sccm respectively into a reaction chamber where the substrate was placed; the pressure in the reaction chamber was set at 170 Pa; the distance between an upper electrode and a lower electrode in the reaction chamber was set at 25 mm; and high-frequency power with a frequency of 13.56 MHz and electrical power of 30 W was supplied to the upper electrode. Note that the temperature of the upper electrode was set at 200° C. and the temperature of the lower electrode was set at 300° C. Here, a phosphine gas diluted with hydrogen is a gas obtained by diluting a phosphine gas with hydrogen to a volume ratio of 0.5%.

Next, the etching mask 211 was formed over the impurity semiconductor film 210 using a resist material. Then, the first semiconductor film 206, the second semiconductor film 208, and the impurity semiconductor film 210 were etched using the etching mask 211, so that the thin film stack 212 was formed. Here, the etching was performed by reactive ion etching. Specifically, a boron trichloride ($BCl_3$) gas, a tetrafluoromethane ($CF_4$) gas, and an oxygen gas were introduced at flow rate of 36 sccm, 36 sccm, and 8 sccm into a reaction chamber where the substrate was placed, the pressure in the reaction chamber was set at 2.0 Pa, high-frequency power with a frequency of 13.56 MHz and electrical power of 450 W was supplied to an upper electrode, and bias power between the upper electrode and a lower electrode was set at 100 W. Note that the temperature of the upper electrode was set at 100° C. and the temperature of the lower electrode was set at 70° C.

Next, oxygen plasma treatment was performed on the thin film stack 212. Specifically, an oxygen gas was introduced at 100 sccm into a reaction chamber where the substrate was placed, the pressure in the reaction chamber was set at 0.67 Pa, the distance between an upper electrode and a lower electrode in the reaction chamber was set at 200 mm, high-frequency power of 2000 W was supplied to the upper electrode, and bias power was set at 350 W. Note that the temperature of the lower electrode was set at −10° C.

Then, the etching mask 211 was removed.

Next, the 300-nm-thick conductive film 214 was formed to cover the thin film stack 212 by a sputtering method. The etching mask 215 was formed over the conductive film 214.

Then, the conductive film 214 was etched using the etching mask 215, so that the second conductive layer 222 was formed and an upper portion of the thin film stack 212 was etched. Through this etching, the impurity semiconductor film 210 was etched to form the impurity semiconductor layer 220 and only an upper portion of the second semiconductor film 208 was etched. Specifically, a boron trichloride ($BCl_3$) gas and a chlorine gas were introduced at flow rate of 60 sccm and 20 sccm into a reaction chamber where the substrate was placed, the pressure in the reaction chamber was set at 1.9 Pa, high-frequency power with a frequency of 13.56 MHz and electrical power of 450 W was supplied to an upper electrode, and bias power between the upper electrode and a lower electrode was set at 100 W. Note that the temperature of the upper electrode was set at 100° C. and the temperature of the lower electrode was set at 70° C. Then, the etching mask 215 was removed.

Next, the second semiconductor film 208 whose upper portion was etched was further etched and part of the first semiconductor film 206 was etched, so that the first semiconductor layer 216 and the second semiconductor layer 218 were formed. Here, in Sample 1 and Sample 2, etching was performed using a mixed gas of $SF_6$, HBr, and $O_2$ and in Comparative Sample 1, etching was performed using a $CF_4$ gas. Detailed etching conditions of Sample 1 and Sample 2 are shown below in Table 1. Note that at this time, an electrode whose area is 340 $cm^2$ was used.

TABLE 1

| | ICP electrical power | bias power [W] | pressure [Pa] | flow rate (sccm) | | |
|---|---|---|---|---|---|---|
| | | | | HBr | $SF_6$ | $O_2$ |
| Sample 1 | 500 | 100 | 1.7 | 125 | 10 | 5 |
| Sample 2 | 500 | 50 | 1.7 | 125 | 10 | 5 |

As for Comparative Sample 1, a $CF_4$ gas was introduced at 100 sccm into a reaction chamber where the substrate was placed, the pressure in the reaction chamber was set at 0.67 Pa, the distance between an upper electrode and a lower electrode in the reaction chamber was set at 200 mm, high-frequency power of 1000 W was supplied to the upper electrode, and bias power was set at 50 W. Note that the temperature of the lower electrode was set at 40° C.

Next, an exposed portion of the first semiconductor layer 216 was exposed to $H_2O$ plasma. Specifically, a moisture ($H_2O$) gas was introduced at 300 sccm into a reaction chamber where the substrate was placed, the pressure in the reaction chamber was set at 66.5 Pa, and high-frequency power with a frequency of 13.56 MHz and electrical power of 1800 W was supplied. Note that the temperature of the lower electrode was set at 250° C.

A 300-nm-thick second insulating film formed of silicon nitride which is to be the second insulating layer 224 was formed to cover the first semiconductor layer 216, the second semiconductor layer 218, the impurity semiconductor layer 220, and the second conductive layer 222 by a plasma CVD method.

Next, an etching mask was formed over the second insulating film and an opening portion was formed by etching the second insulating film with the use of the etching mask, so that the second insulating layer 224 was formed. The opening portion was formed to overlap with a portion of the second conductive layer 222 which is to be a source electrode or a drain electrode.

Next, a 50-nm-thick conductive film which is to be the third conductive layer 226 was formed over the second insulating layer 224 by a sputtering method. Then, an etching mask was formed over the conductive film and etching was performed, so that the third conductive layer 226 was formed.

Figure 15A:
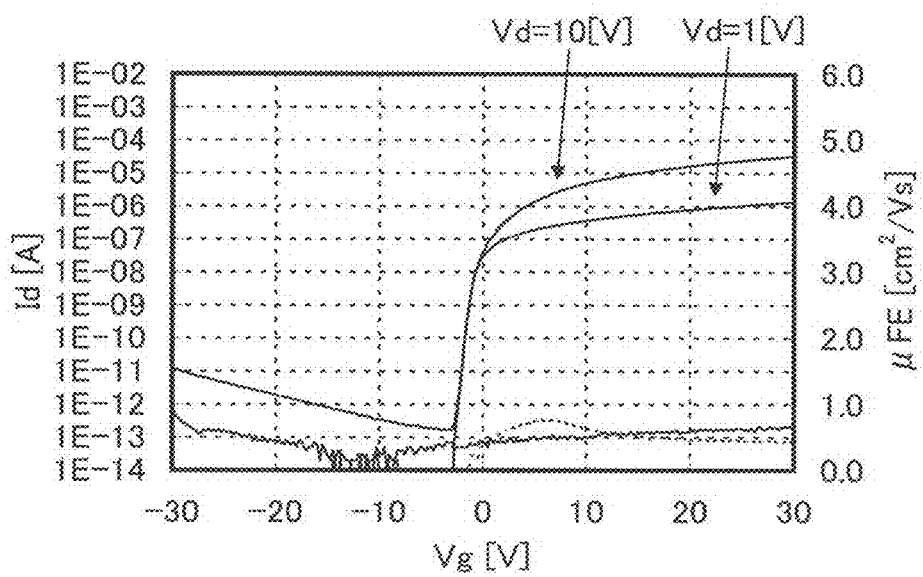
FIGS. 15A and 15B show characteristics of Sample in Example 2.
Figure 15B:
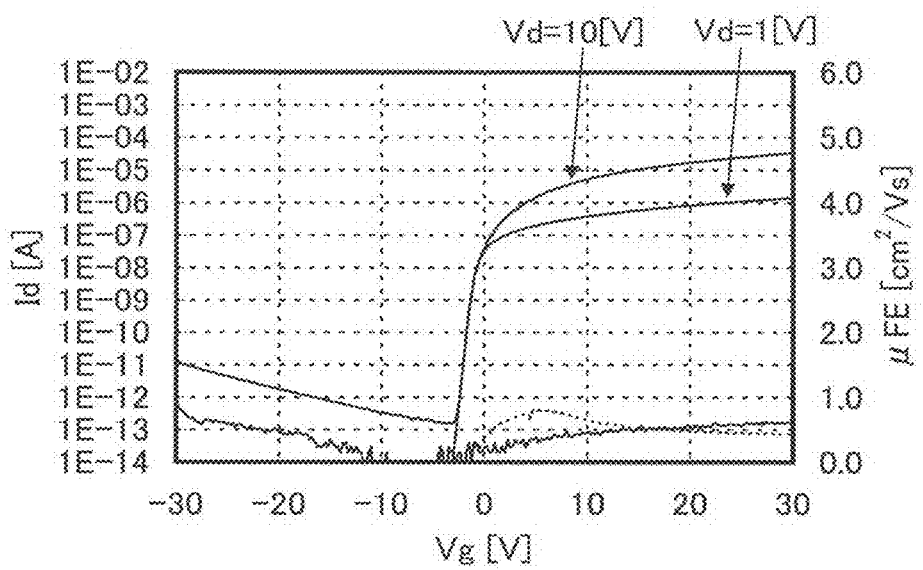
Figure 16:
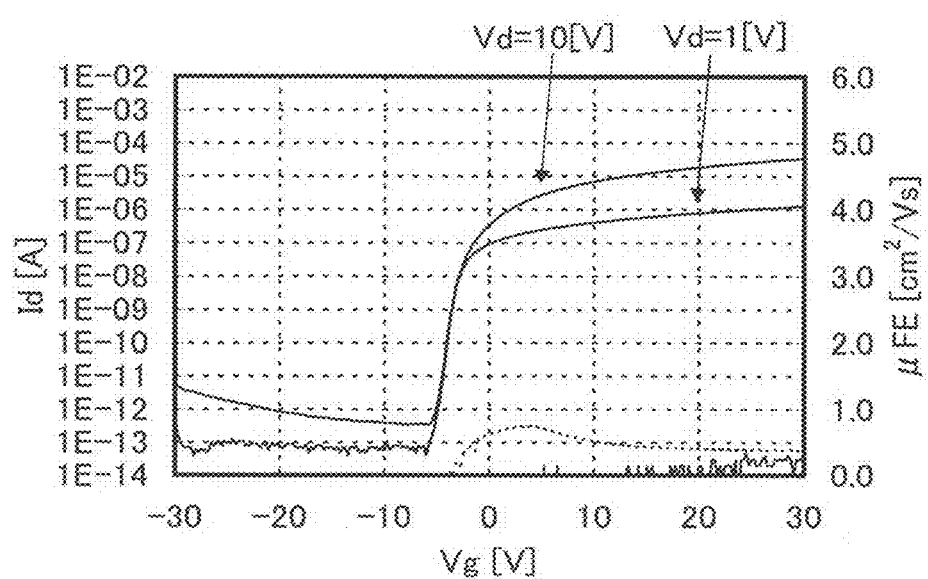
FIG. 16 shows characteristics of Comparative Sample in Example 2.

Id-Vg curves of Sample 1, Sample 2, and Comparative Sample 1 formed as described above were obtained. FIG. 15A shows the Id-Vg curve obtained from Sample 1, FIG. 15B shows the Id-Vg curve obtained from Sample 2, and FIG. 16 shows the Id-Vg curve obtained from Comparative Sample 1.

Here, Id refers to a current flowing between a source electrode and a drain electrode. Vg refers to the potential difference between the potential of the source electrode and the potential of the gate electrode in the case where the potential of the source electrode is a reference potential.

When Sample 1 and Comparative Sample 1 are compared, the subthreshold swing value (S value) of Sample 1 is smaller than that of Comparative Sample 1.

When Sample 1 and Comparative Sample 1 are compared, the threshold voltage of Sample 1 can be more shifted to the positive side.

Even when the off-state current is a minimum value or a gate voltage is by 10 V lower than a gate voltage when the off-state current is the minimum value, the off-state current can be smaller in Sample 1 than in Comparative Sample 1.

The results of comparing the above electric characteristics are shown in Table 2.

TABLE 2

| | S value [V/dec.] | threshold voltage [V] | Ioff[pA] (minimum value) | Ioff[pA] (Vgs is by 10 V lower than Vgs in minimum value |
|---|---|---|---|---|
| Sample 1 | 0.33 | −0.19 | 0.27 | 1.03 |
| Comparative Sample | 0.38 | −2.43 | 0.55 | 5.77 |

When Sample 1 and Sample 2 are compared, the on-state current and the mobility of Sample 2 are higher than those of Sample 1.

The results of comparing the above electric characteristics are shown in Table 3.

TABLE 3

| | Ion[µA] (Vg = 15 V) | field-effect mobility [$cm^2$/Vs] |
|---|---|---|
| Sample 1 | 11.71 | 0.91 |
| Sample 2 | 12.4 | 0.94 |

As described above, when the semiconductor device of one embodiment of the present invention is used, at least an S value can be small, a threshold voltage can be shifted to the positive side, and off-state current can be reduced.

Moreover, at the time when etching for exposing a channel formation region is performed, bias power may be reduced. The bias power may be greater than 0 W and less than or equal to 100 W, more preferably greater than 0 W and less than or equal to 50 W.

Figure 17:
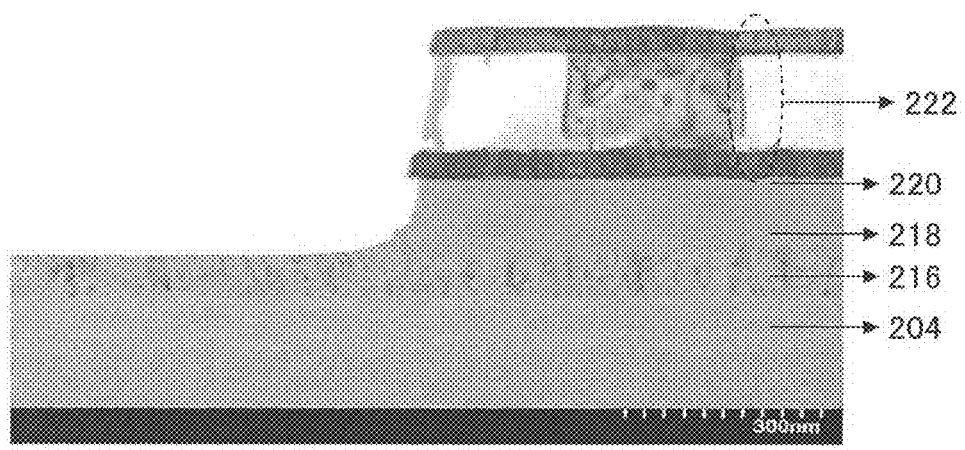
FIG. 17 is a STEM image of Sample manufactured in Example 2.

Further, FIG. 17 shows a STEM image of the exposed portion of the first semiconductor layer 216 in the semiconductor device manufactured in the above manner. As shown in FIG. 17, there is almost no difference between the thickness of the first semiconductor layer 216 overlapping with the second semiconductor layer 218 and the thickness of the first semiconductor layer 216 which does not overlap with the second semiconductor layer 218. This is because high etching selectivity of the second semiconductor film 208 to the first semiconductor film 206 can be obtained in the etching step for exposing part of the first semiconductor layer 216.

Figure 22:
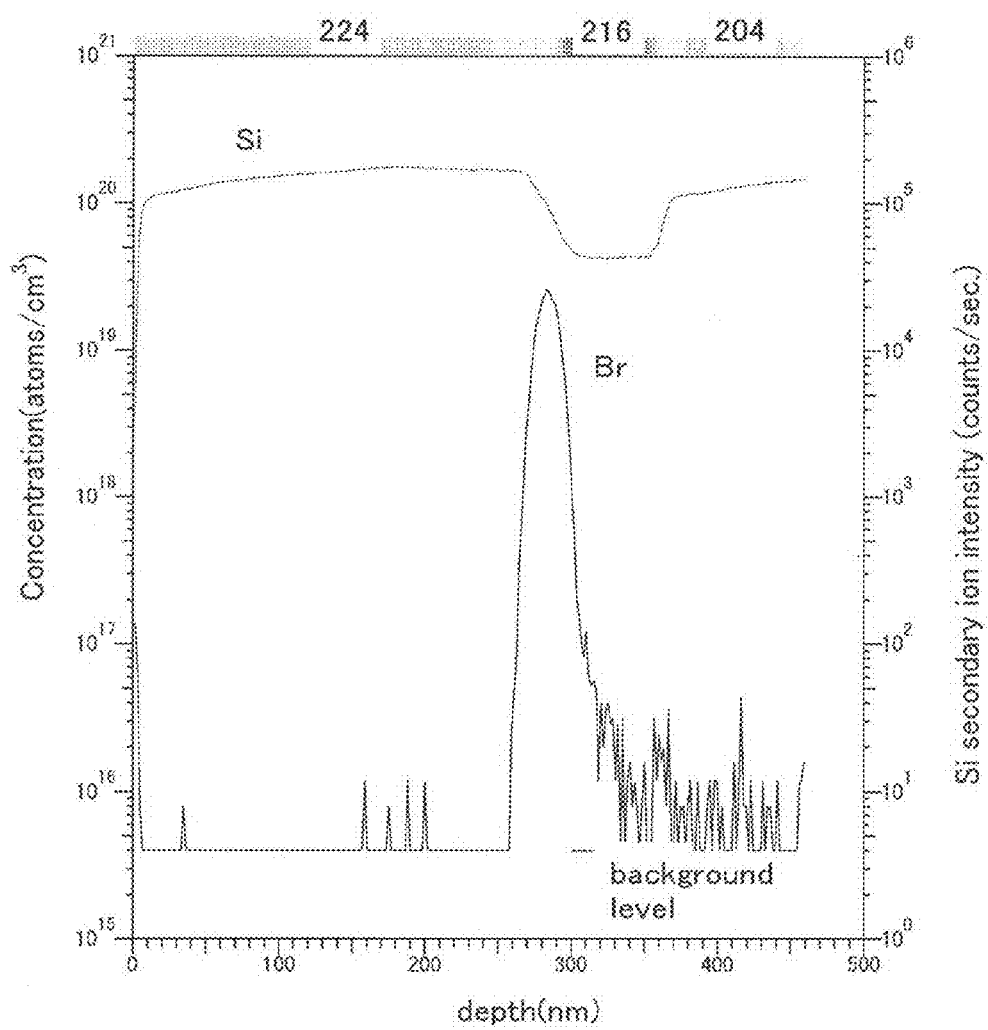
FIG. 22 is SIMS data of Sample in Example 2.
Figure 23:
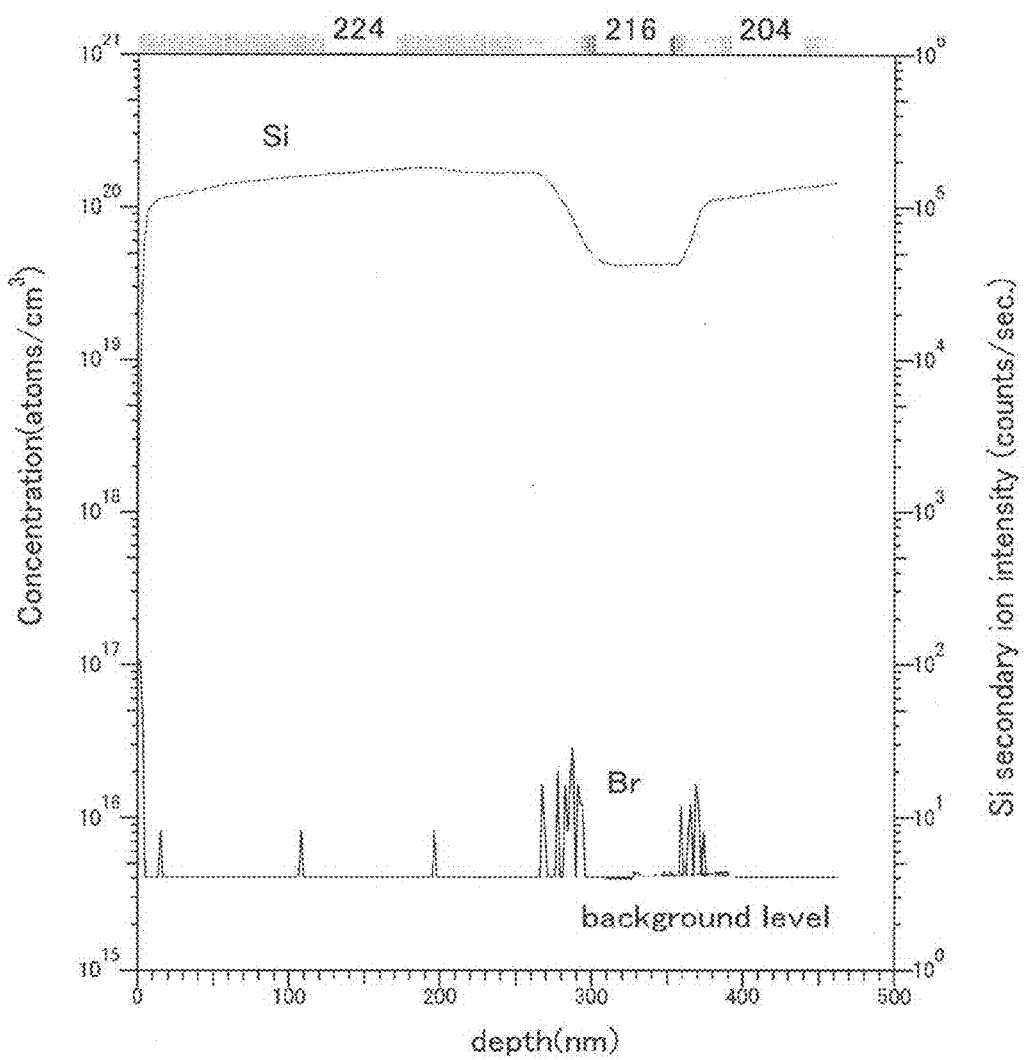
FIG. 23 is SIMS data of Comparative Sample 1.

FIG. 22 shows SIMS data of the exposed portion of the first semiconductor layer 216 (a portion in contact with the second insulating layer 224) in Sample 2. FIG. 23 shows SIMS data of the exposed portion of the first semiconductor layer 216 (a portion in contact with the second insulating layer 224) in Comparative Sample 1.

When FIG. 22 and FIG. 23 are compared, almost no Br is detected in the exposed portion of the first semiconductor layer 216 in Comparative Sample 1. On the other hand, Br is detected at a concentration of greater than or equal to $1.0 \times 10^{19}$ atoms/$cm^3$ and less than or equal to $1.0 \times 10^{20}$ atoms/$cm^3$ in the exposed portion of the first semiconductor layer 216 in Sample 2. Note that in FIG. 22, a slight amount of Br is detected due to interfering ions.

EXAMPLE 3

In this example, the thin film transistors of Embodiment 3 were manufactured and the characteristics of the thin film transistors were examined and compared. Here, Sample 3 and Comparative Sample 2 were manufactured.

First, a 200-nm-thick base film formed of SiON was formed over a substrate by a plasma CVD method. Next, a conductive film to be the first conductive layer 402 was formed over the base film by a sputtering method and processed, so that the first conductive layer 402 was formed. The first conductive layer 402 had a structure in which a 50-nm-thick Ti layer, a 100-nm-thick Al layer, and a 50-nm-thick Ti layer were stacked.

Next, the 300-nm-thick first insulating layer 404 formed of silicon nitride was formed to cover the first conductive layer 402 by a plasma CVD method. Specifically, a monosilane gas, an ammonia gas, a nitrogen gas, and a hydrogen gas were introduced at 15 sccm, 500 sccm, 180 sccm, and 200 sccm respectively into a reaction chamber where the substrate was placed; the pressure in the reaction chamber was set at 100 Pa; the distance between an upper electrode and a lower electrode in the reaction chamber was set at 26 mm; and high-frequency power with a frequency of 13.56 MHz and electrical power of 200 W was supplied to the upper electrode. Note that the temperature of the upper electrode was set at 200° C. and the temperature of the lower electrode was set at 300° C.

Next, plasma treatment was performed on a surface of the first insulating layer 404. Specifically, a dinitrogen monoxide ($N_2O$) gas was introduced at a flow rate of 400 sccm into a reaction chamber where the substrate was placed, the pressure in the reaction chamber was set at 60 Pa, the distance between an upper electrode and a lower electrode which were provided in the reaction chamber was set at 30 mm, and high-frequency power with a frequency of 13.56 MHz and electrical power of 300 W was supplied to the upper electrode. Note that the temperature of the upper electrode was set at 200° C. and the temperature of the lower electrode was set at 300° C.

Next, the first semiconductor film 406 was formed over the first insulating layer 404 after the plasma treatment. Note that in this example, the first semiconductor film 406 was formed through two-step film formation process. Through the two-step film formation process, a 5-nm-thick microcrystalline silicon film was formed at the first stage and a 65-nm-thick microcrystalline silicon film was formed at the second stage. Specifically, at the first stage, a monosilane gas, an argon gas, and a hydrogen gas were introduced at 4 sccm, 750 sccm, and 750 sccm respectively into a reaction chamber where the substrate was placed; the pressure in the reaction chamber was set at 532 Pa; the distance between an upper electrode and a lower electrode in the reaction chamber was set at 15 mm; and high-frequency power with a frequency of 13.56 MHz and electrical power of 150 W was supplied to the upper electrode. Note that the temperature of the upper electrode was set at 200° C. and the temperature of the lower electrode was set at 300° C. At the second stage, a monosilane gas, an argon gas, and a hydrogen gas were introduced at 0.3 sccm, 750 sccm, and 750 sccm respectively into a reaction chamber where the substrate was placed; the pressure in the reaction chamber was set at 5000 Pa; the distance between the upper electrode and the lower electrode in the reaction chamber was set at 15 mm; and high-frequency power with a frequency of 13.56 MHz and electrical power of 250 W was supplied to the upper electrode. Note that the temperature of the upper electrode was set at 200° C. and the temperature of the lower electrode was set at 300° C.

Next, the 80-nm-thick second semiconductor film 408 was formed over the first semiconductor film 406. Specifically, a monosilane gas, an ammonia gas diluted with hydrogen, an argon gas, and a hydrogen gas were introduced at 25 sccm, 100 sccm, 750 sccm and 650 sccm respectively into a reaction chamber where the substrate was placed; the pressure in the reaction chamber was set at 1250 Pa; the distance between an upper electrode and a lower electrode in the reaction chamber was set at 15 mm; and high-frequency power with a frequency of 13.56 MHz and electrical power of 150 W was supplied to the upper electrode. Note that the temperature of the upper electrode was set at 200° C. and the temperature of the lower electrode was set at 300° C.

Note that here, the ammonia gas diluted with hydrogen is a gas obtained by diluting an ammonia gas with hydrogen to 1000 ppm.

Next, the 50-nm-thick impurity semiconductor film 410 was formed over the second semiconductor film 408. Specifically, a monosilane gas, a phosphine gas diluted with hydrogen, and a hydrogen gas were introduced at 90 sccm, 10 sccm, and 500 sccm respectively into a reaction chamber where the substrate was placed; the pressure in the reaction chamber was set at 170 Pa; the distance between an upper electrode and a lower electrode in the reaction chamber was set at 25 mm; and high-frequency power with a frequency of 13.56 MHz and electrical power of 30 W was supplied to the upper electrode. Note that the temperature of the upper electrode was set at 200° C. and the temperature of the lower electrode was set at 300° C.

Next, the etching mask 411 was formed over the impurity semiconductor film 410 using a resist material. Then, the first semiconductor film 406, the second semiconductor film 408, and the impurity semiconductor film 410 were etched using the etching mask 411, so that the thin film stack 412 was formed. Here, the etching was performed by reactive ion etching. Specifically, a boron trichloride ($BCl_3$) gas, a tetrafluoromethane ($CF_4$) gas, and an oxygen gas were introduced at flow rate of 36 sccm, 36 sccm, and 8 sccm into a reaction chamber where the substrate was placed, the pressure in the reaction chamber was set at 2.0 Pa, high-frequency power with a frequency of 13.56 MHz and electrical power of 450 W was supplied to an upper electrode, and bias power between the upper electrode and a lower electrode was set at 100 W. Note that the temperature of the upper electrode was set at 100° C. and the temperature of the lower electrode was set at 70° C.

Next, oxygen plasma treatment was performed on the thin film stack 412. Specifically, an oxygen gas was introduced at 100 sccm into a reaction chamber where the substrate was placed, the pressure in the reaction chamber was set at 0.67 Pa, the distance between an upper electrode and a lower electrode in the reaction chamber was set at 200 mm, high-frequency power of 2000 W was supplied to the upper electrode, and bias power was set at 350 W. Note that the temperature of the lower electrode was set at −10° C.

Then, the etching mask 411 was removed.

Next, the 300-nm-thick conductive film 414 was formed to cover the thin film stack 412 by a sputtering method.

Next, the 100-nm-thick insulating film 416 formed of silicon nitride was formed over the conductive film 414 by a plasma CVD method. Specifically, a monosilane gas, an ammonia gas, a nitrogen gas, and a hydrogen gas were introduced at 15 sccm, 500 sccm, 180 sccm, and 200 sccm respectively into a reaction chamber where the substrate was placed; the pressure in the reaction chamber was set at 100 Pa; the distance between an upper electrode and a lower electrode in the reaction chamber was set at 26 mm; and high-frequency power with a frequency of 13.56 MHz and electrical power of 200 W was supplied to the upper electrode. Note that the temperature of the upper electrode was set at 200° C. and the temperature of the lower electrode was set at 300° C. Then, the etching mask 417 was formed over the insulating film 416.

Then, the insulating film 416 was etched using the etching mask 417. Specifically, a $CHF_3$ gas and a He gas were introduced at flow rate of 50 sccm and 100 sccm into a reaction chamber where the substrate was placed, the pressure in the reaction chamber was set at 5.5 Pa, high-frequency power with a frequency of 13.56 MHz and electrical power of 475 W was supplied to an upper electrode, and bias power between the upper electrode and a lower electrode was set at 300 W. Note that the temperature of the upper electrode was set at 100° C. and the temperature of the lower electrode was set at 70° C.

Then, the conductive film 414 was etched using the etching mask 417, so that the second conductive layer 420 was formed and an upper portion of the thin film stack 412 was etched. Through this etching, the impurity semiconductor film 410 was etched to form the impurity semiconductor layer 426 and only an upper portion of the second semiconductor film 408 was etched. Specifically, a boron trichloride ($BCl_3$) gas and a chlorine gas were introduced at flow rate of 60 sccm and 20 sccm into a reaction chamber where the substrate was placed, the pressure in the reaction chamber was set at 1.9 Pa, high-frequency power with a frequency of 13.56 MHz and electrical power of 450 W was supplied to an upper electrode, and bias power between the upper electrode and a lower electrode was set at 100 W. Note that the temperature of the upper electrode was set at 100° C. and the temperature of the lower electrode was set at 70° C. Then, the etching mask 417 was removed.

Next, the second semiconductor film 408 whose upper portion was etched was further etched and part of the first semiconductor film 406 was etched, so that the first semiconductor layer 422 and the second semiconductor layer 424 were formed. Here, in Sample 3, etching was performed using a mixed gas of $SF_6$, HBr, and $O_2$ and in Comparative Sample 2, etching was performed using a $CF_4$ gas. Note that at that time, an electrode whose area is 340 $cm^2$ was used.

Here, in Sample 3, a $SF_6$ gas, a HBr gas, and an oxygen gas were introduced at flow rate of 10 sccm, 125 sccm, and 5 sccm into a reaction chamber where the substrate was placed, the pressure in the reaction chamber was set at 1.7 Pa, high-frequency power with a frequency of 13.56 MHz and electrical power of 500 W was supplied to an upper electrode, and bias power between the upper electrode and a lower electrode was set at 50 W. Note that the temperature of the upper electrode was set at 100° C. and the temperature of the lower electrode was set at 70° C.

As for Comparative Sample 2, a $CF_4$ gas was introduced at 100 sccm into a reaction chamber where the substrate was placed, the pressure in the reaction chamber was set at 0.67 Pa, the distance between an upper electrode and a lower electrode in the reaction chamber was set at 200 mm, high-frequency power of 1000 W was supplied to the upper electrode, and bias power was set at 50 W. Note that the temperature of the lower electrode was set at 40° C.

Next, an exposed portion of the first semiconductor layer 422 was exposed to $H_2O$ plasma. Specifically, a moisture ($H_2O$) gas was introduced at 300 sccm into a reaction chamber where the substrate was placed, the pressure in the reaction chamber was set at 66.5 Pa, and high-frequency power with a frequency of 13.56 MHz and electrical power of 1800 W was supplied. Note that the temperature of the lower electrode was set at 250° C.

A 300-nm-thick insulating film formed of silicon nitride which is to be the third insulating layer 428 was formed to cover the first semiconductor layer 422, the second semiconductor layer 424, the impurity semiconductor layer 426, the second conductive layer 420, and the second insulating layer 418 by a plasma CVD method.

Next, an etching mask was formed over the insulating film and an opening portion was formed by etching the insulating film with the use of the etching mask, so that the second insulating layer 418 was formed. The opening portion was formed to overlap with a portion of the second conductive layer 420 which is to be a source electrode or a drain electrode.

Next, a 50-nm-thick conductive film which is to be the third conductive layer 430 was formed over the third insulating layer 428 by a sputtering method. Then, an etching mask was formed over the conductive film and etching was performed, so that the third conductive layer 430 was formed.

Figure 18:
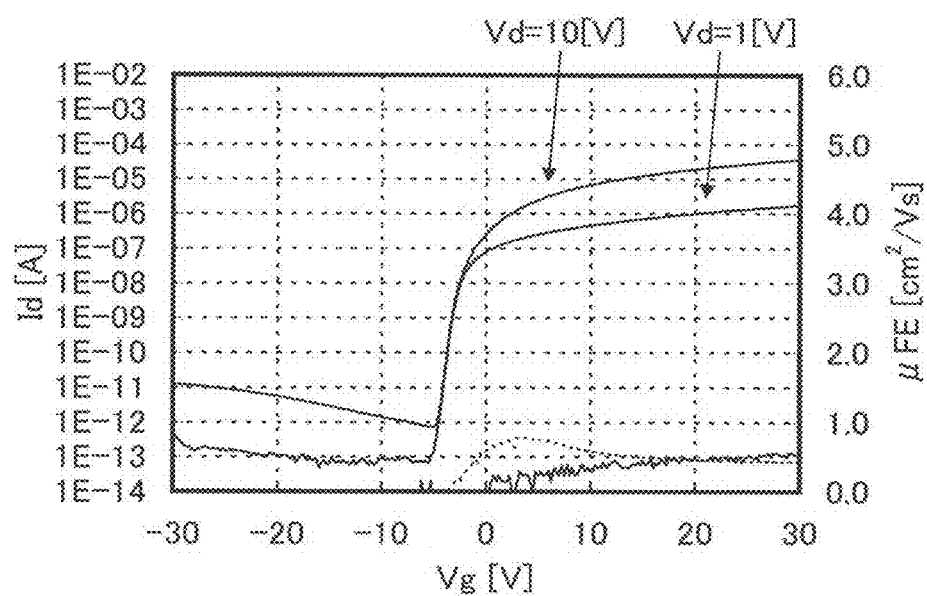
FIG. 18 shows characteristics of Sample in Example 3.
Figure 19:
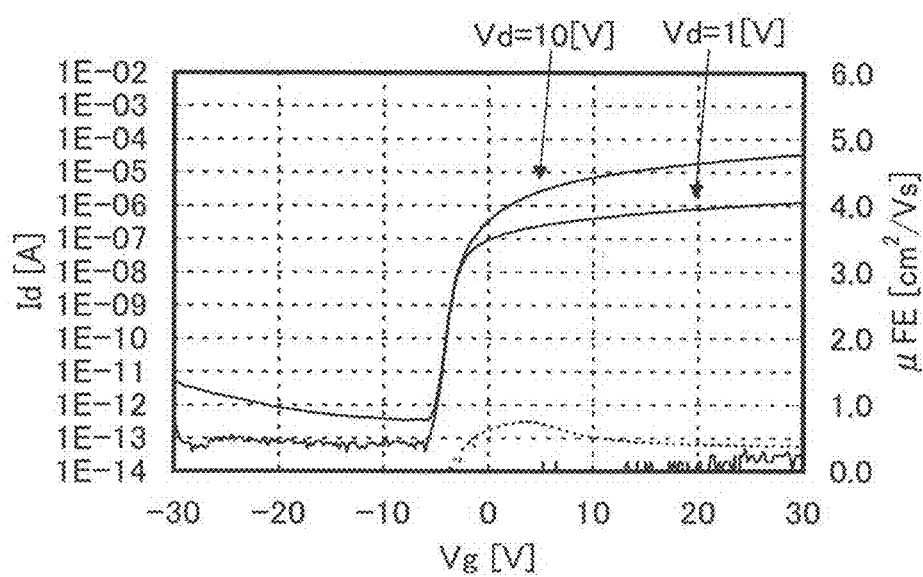
FIG. 19 shows characteristics of Comparative Sample in Example 3.

Id-Vg curves of Sample 3 and Comparative Sample 2 formed as described above were obtained. FIG. 18 shows the Id-Vg curve obtained from Sample 3 and FIG. 19 shows the Id-Vg curve obtained from Comparative Sample 2.

Here, Id refers to a current flowing between a source electrode and a drain electrode. Vg refers to the potential difference between the potential of the source electrode and the potential of the gate electrode in the case where the potential of the source electrode is a reference potential.

When Sample 3 and Comparative Sample 2 are compared, as for off-state current value in the case where a gate voltage is by 10 V lower than a gate voltage when the off-state current is minimum value, the off-state current in Sample 3 is smaller than that in Comparative Sample 2.

When Sample 3 and Comparative Sample 2 are compared, the threshold voltage of Sample 3 is higher than that of Comparative Sample 2.

When Sample 3 and Comparative Sample 2 are compared, the field-effect mobility of Sample 3 is higher than that of Comparative Sample 2.

When Sample 3 and Comparative Sample 2 are compared, the off-state current of Sample 3 is lower than that of Comparative Sample 2.

The results of comparing the above electric characteristics are shown in Table 4.

TABLE 4

|  | Ioff[pA] (Vgs is by 10 V lower than Vgs in minimum value | threshold voltage [V] | field-effect mobility [cm2/Vs] |
|---|---|---|---|
| Sample 3 | 4.9 | −1.99 | 0.96 |
| Comparative Sample 2 | 5.7 | −2.43 | 0.9 |

As described above, it is found that when the method for manufacturing a semiconductor device of one embodiment of the present invention is applied, at least an off-state current value can be small, a threshold voltage can be reduced, and field-effect mobility can be high.

This application is based on Japanese Patent Application serial No. 2010-189928 filed with Japan Patent Office on Aug. 26, 2010 and Japanese Patent Application serial No. 2010-190075 filed with Japan Patent Office on Aug. 26, 2010 the entire contents of which are hereby incorporated by reference.

What is claimed is:

1. A method for manufacturing a semiconductor device comprising:
   forming an insulating layer to cover a first conductive layer;

forming a crystalline semiconductor film over the insulating layer;

forming an amorphous semiconductor film over the crystalline semiconductor film;

forming an impurity semiconductor film over the amorphous semiconductor film;

forming a first etching mask over the impurity semiconductor film;

forming a thin film stack by removing a portion of the crystalline semiconductor film, the amorphous semiconductor film, and the impurity semiconductor film which does not overlap with the first etching mask and processing the crystalline semiconductor film, the amorphous semiconductor film, and the impurity semiconductor film to have an island shape;

removing the first etching mask;

forming a conductive film which is to be a second conductive layer over the thin film stack;

forming a second etching mask over the conductive film;

forming the second conductive layer by etching the conductive film; and exposing a portion of the crystalline semiconductor film which does not overlap with the second conductive layer by etching a region of the thin film stack which does not overlap with the second conductive layer, wherein a mixed gas including a Br-based gas, a F-based gas, and an oxygen gas is used in the etching for exposing the crystalline semiconductor film.

2. The method for manufacturing a semiconductor device, according to claim 1, wherein the second etching mask is removed before performing the etching for exposing the portion of the crystalline semiconductor film which does not overlap with the second conductive layer.

3. The method for manufacturing a semiconductor device, according to claim 1, wherein the etching with the use of the mixed gas is performed with bias power greater than 0 W and less than or equal to 100 W.

4. The method for manufacturing a semiconductor device, according to claim 1, wherein the Br-based gas is a HBr gas.

5. The method for manufacturing a semiconductor device, according to claim 1, wherein the F-based gas is a $SF_6$ gas.

6. The method for manufacturing a semiconductor device, according to claim 1, wherein a flow ratio of the Br-based gas, the F-based gas, and the oxygen gas is 25:2:1.

7. The method for manufacturing a semiconductor device, according to claim 1, wherein the crystalline semiconductor film is a microcrystalline semiconductor film.

8. The method for manufacturing a semiconductor device, according to claim 1, wherein the microcrystalline semiconductor film is formed of microcrystalline silicon and the amorphous semiconductor film is formed of amorphous silicon.

9. The method for manufacturing a semiconductor device, according to claim 1, wherein a value of Br detected in the exposed portion of the crystalline semiconductor film by SIMS is greater than or equal to $1.0 \times 10^{19}$ atoms/cm$^3$ and less than or equal to $1.0 \times 10^{20}$ atoms/cm$^3$.

10. A method for manufacturing a semiconductor device comprising:

forming a first insulating layer to cover a first conductive layer;

forming a crystalline semiconductor film over the first insulating layer;

forming an amorphous semiconductor film over the crystalline semiconductor film;

forming an impurity semiconductor film over the amorphous semiconductor film;

forming a first etching mask over the impurity semiconductor film;

forming a thin film stack by removing a portion of the crystalline semiconductor film, the amorphous semiconductor film, and the impurity semiconductor film which does not overlap with the first etching mask and processing the crystalline semiconductor film, the amorphous semiconductor film, and the impurity semiconductor film to have an island shape;

removing the first etching mask;

forming a conductive film which is to be a second conductive layer and an insulating film which is to be a second insulating layer over the thin film stack;

forming a second etching mask over the insulating film;

forming the second insulating layer by etching the insulating film;

forming the second conductive layer by etching the conductive film; and exposing a portion of the crystalline semiconductor film which does not overlap with the second conductive layer by etching a region of the thin film stack which does not overlap with the second conductive layer, wherein a mixed gas including a Br-based gas, a F-based gas, and an oxygen gas is used in the etching for exposing the crystalline semiconductor film.

11. The method for manufacturing a semiconductor device, according to claim 10, wherein the second insulating layer and the second conductive layer are formed through the same etching step.

12. The method for manufacturing a semiconductor device, according to claim 10, wherein the second etching mask is removed before performing the etching for exposing the portion of the crystalline semiconductor film which does not overlap with the second conductive layer.

13. The method for manufacturing a semiconductor device, according to claim 10, wherein the etching with the use of the mixed gas is performed with bias power greater than 0 W and less than or equal to 100 W.

14. The method for manufacturing a semiconductor device, according to claim 10, wherein the Br-based gas is a HBr gas.

15. The method for manufacturing a semiconductor device, according to claim 10, wherein the F-based gas is a $SF_6$ gas.

16. The method for manufacturing a semiconductor device, according to claim 10, wherein a flow ratio of the Br-based gas, the F-based gas, and the oxygen gas is 25:2:1.

17. The method for manufacturing a semiconductor device, according to claim 10, wherein the crystalline semiconductor film is a microcrystalline semiconductor film.

18. The method for manufacturing a semiconductor device, according to claim 17, wherein the microcrystalline semiconductor film is formed of microcrystalline silicon and the amorphous semiconductor film is formed of amorphous silicon.

19. The method for manufacturing a semiconductor device, according to claim 10, wherein a value of Br detected in the exposed portion of the crystalline semiconductor film by SIMS is greater than or equal to $1.0 \times 10^{19}$ atoms/cm$^3$ and less than or equal to $1.0 \times 10^{20}$ atoms/cm$^3$.

\* \* \* \* \*

UNITED STATES PATENT AND TRADEMARK OFFICE
CERTIFICATE OF CORRECTION

PATENT NO.        : 9,230,826 B2
APPLICATION NO.   : 13/213130
DATED             : January 5, 2016
INVENTOR(S)       : Shinya Sasagawa et al.

Page 1 of 1

It is certified that error appears in the above-identified patent and that said Letters Patent is hereby corrected as shown below:

In the Specification:

Col. 20, line 44, "illustrated in FIG. HA," should read --illustrated in FIG. 11A,--

In the Claims:

Col. 35, line 55, Claim 8, "according to claim 1," should read --according to claim 7,--

Signed and Sealed this
Twenty-eighth Day of June, 2016

Michelle K. Lee
*Director of the United States Patent and Trademark Office*